US011479851B2

(12) United States Patent
Jakob et al.

(10) Patent No.: US 11,479,851 B2
(45) Date of Patent: Oct. 25, 2022

(54) SUBSTRATE HOLDER ARRANGEMENT WITH MASK SUPPORT

(71) Applicant: AIXTRON SE, Herzogenrath (DE)

(72) Inventors: Markus Jakob, Monschau (DE); Wilhelmus Janssen, JD Sittard (NL); Steffen Neumann, Titz-Ameln (DE); Jaap Oudes, EP Eindhoven (NL)

(73) Assignee: AIXTRON SE, Herzogenrath (DE)

( * ) Notice: Subject to any disclaimer, the term of this patent is extended or adjusted under 35 U.S.C. 154(b) by 263 days.

(21) Appl. No.: 16/493,738

(22) PCT Filed: Mar. 12, 2018

(86) PCT No.: PCT/EP2018/056034
§ 371 (c)(1),
(2) Date: Sep. 12, 2019

(87) PCT Pub. No.: WO2018/166954
PCT Pub. Date: Sep. 20, 2018

(65) Prior Publication Data
US 2020/0010951 A1    Jan. 9, 2020

(30) Foreign Application Priority Data

Mar. 14, 2017   (DE) ..................... 10 2017 105 379.4

(51) Int. Cl.
*C23C 14/04*       (2006.01)
*C23C 16/04*       (2006.01)
(52) U.S. Cl.
CPC .......... *C23C 16/042* (2013.01); *C23C 14/042* (2013.01)
(58) Field of Classification Search
CPC ....... C23C 14/042; C23C 16/042; C23C 8/04; C23C 10/04; C23C 14/04; C23C 14/044;
(Continued)

(56) References Cited

U.S. PATENT DOCUMENTS

| 4,984,531 A | 1/1991 | Zejda et al. |
| 6,024,800 A | 2/2000 | Soejima et al. |
| (Continued) | | |

FOREIGN PATENT DOCUMENTS

| DE | 10 2008 037 387 A1 | 3/2010 |
| DE | 10 2010 000 447 A1 | 8/2011 |
| (Continued) | | |

OTHER PUBLICATIONS

International Search Report dated Jul. 2, 2018, from the ISA/European Patent Office, for International Patent Application No. PCT/EP2018/056033 (filed Mar. 12, 2018), 6 pages.

(Continued)

*Primary Examiner* — Aiden Lee
(74) *Attorney, Agent, or Firm* — Ascenda Law Group, PC

(57) ABSTRACT

A device for depositing a layer, which has been structured by the application of a mask, on a substrate, includes an adjusting device for adjusting the position of a mask support with respect to a support frame. The device also includes, a mask lifting device, by which the support frame, together with the mask support, the adjusting device and a mask assembly, can be vertically displaced from a mask changing position into a processing position. The device also includes a substrate holder lifting device, by which the substrate holder can be vertically displaced from a loading position into a processing position. Restraining means, which include a V-groove and a spherical surface, restrain the substrate holder in the processing position on the support frame. The spherical surface, formed by a ball element of the support frame, is supported on flanks of the V-groove that is formed by the substrate holder.

20 Claims, 18 Drawing Sheets

(58) Field of Classification Search
CPC ..... C23C 16/04; C23C 18/06; H01L 51/0011; C30B 25/04
See application file for complete search history.

(56) References Cited

U.S. PATENT DOCUMENTS

| | | | |
|---|---|---|---|
| 6,459,474 | B1 | 10/2002 | Okada |
| 2006/0066963 | A1* | 3/2006 | Sudoh .................... G02B 7/022 |
| | | | 359/819 |
| 2007/0006807 | A1 | 1/2007 | Manz |
| 2015/0024147 | A1 | 1/2015 | Lee et al. |
| 2016/0362788 | A1* | 12/2016 | Kurita ................... C23C 16/042 |
| 2016/0372715 | A1 | 12/2016 | Seo et al. |

FOREIGN PATENT DOCUMENTS

| | | |
|---|---|---|
| DE | 10 2011 101 088 A1 | 11/2012 |
| DE | 10 2014 116 991 A1 | 5/2016 |
| GB | 190927667 A | 11/1909 |
| GB | 978984 A | 1/1965 |
| KR | 2014 0100119 A | 8/2014 |
| KR | 2014 0115484 A | 10/2014 |
| WO | 2006/090748 A1 | 8/2006 |
| WO | 2007/023533 A1 | 3/2007 |
| WO | 2012/173692 A1 | 12/2012 |
| WO | 2012/175128 A1 | 12/2012 |
| WO | 2015/112467 A1 | 7/2015 |

OTHER PUBLICATIONS

Written Opinion dated Jul. 2, 2018, from the ISA/European Patent Office, for International Patent Application No. PCT/EP2018/056033 (filed Mar. 12, 2018), 9 pages.
Preliminary Amendment filed Oct. 2, 2019, for U.S. Appl. No. 16/493,737, filed Sep. 12, 2019, 13 pages.
Written Opinion dated Jul. 2, 2018, from the ISA/European Patent Office, for International Patent Application No. PCT/EP2018/056033 (filed Mar. 12, 2018), English Translation, 7 pgs.
Written Opinion dated Oct. 8, 2018, from the ISA/European Patent Office, for International Patent Application No. PCT/EP2018/056034 (filed Mar. 12, 2018), English Translation, 9 pgs.
International Preliminary Report on Patentability dated Sep. 17, 2019, from The International Bureau of WIPO, for International Patent Application No. PCT/EP2018/056033 (filed Mar. 12, 2018), 18 pgs.
International Preliminary Report on Patentability dated Sep. 17, 2019, from The International Bureau of WIPO, for International Patent Application No. PCT/EP2018/056034, 22 pgs.
Restriction Requirement dated Aug. 13, 2021, for U.S. Appl. No. 16/493,737, filed Sep. 12, 2019, 8 pgs.
Amendment filed Oct. 11, 2021, for U.S. Appl. No. 16/493,737, filed Sep. 12, 2019, 7 pgs.
International Search Report dated Oct. 8, 2018, from the ISA/European Patent Office, for International Patent Application No. PCT/EP2018/056034 (filed Mar. 12, 2018), 9 pages.
Written Opinion dated Oct. 8, 2018, from the ISA/European Patent Office, for International Patent Application No. PCT/EP2018/056034 (filed Mar. 12, 2018), 11 pages.
Non-Final Office Action dated Dec. 20, 2021, for U.S. Appl. No. 16/493,737, filed Sep. 12, 2019, 22 pgs.
Amendment filed Mar. 16, 2022, for U.S. Appl. No. 16/493,737, filed Sep. 12, 2019, 14 pgs.
Notice of Allowance dated Apr. 15, 2022, for U.S. Appl. No. 16/493,737, filed Sep. 12, 2019, 10 pgs.

* cited by examiner

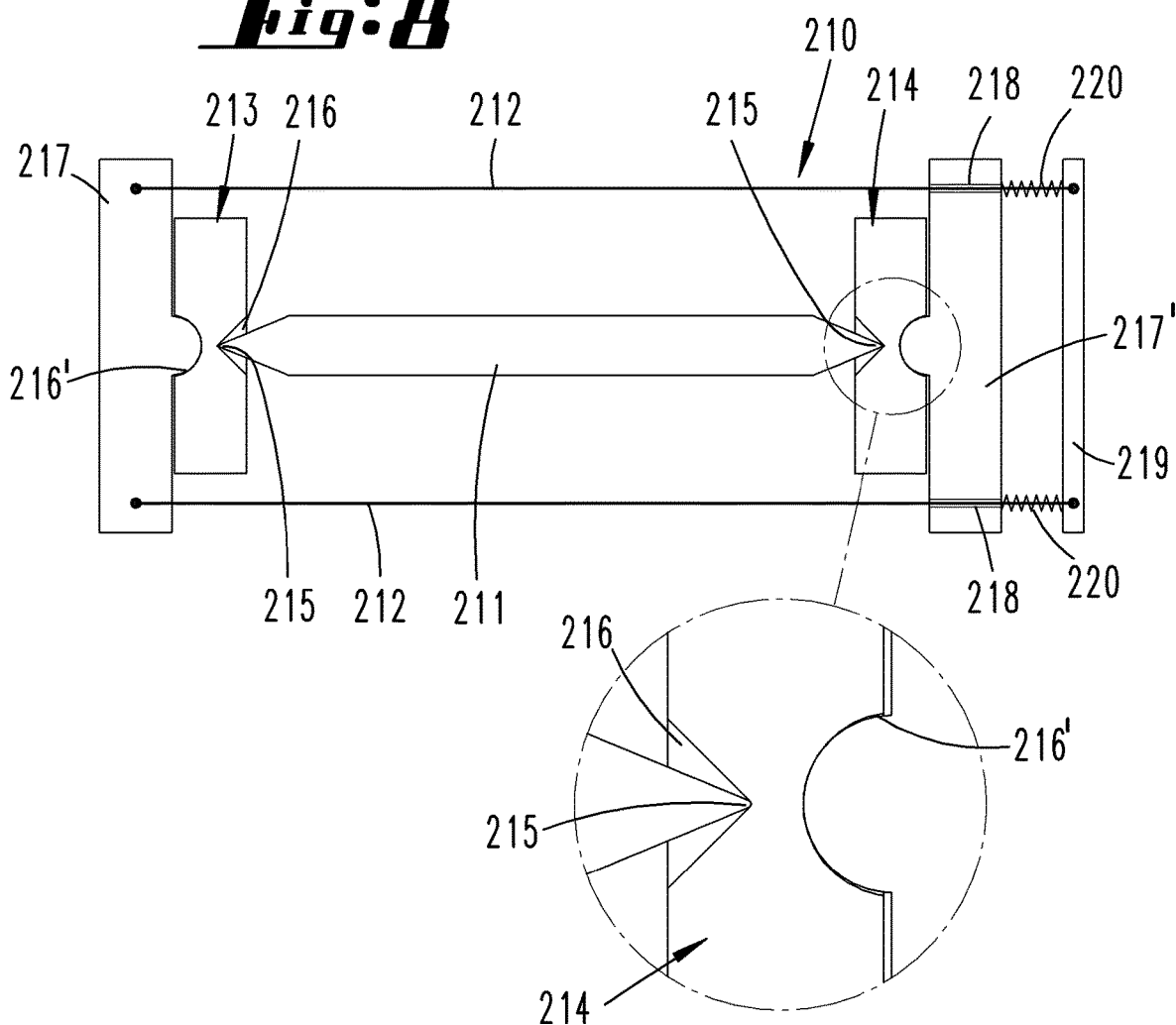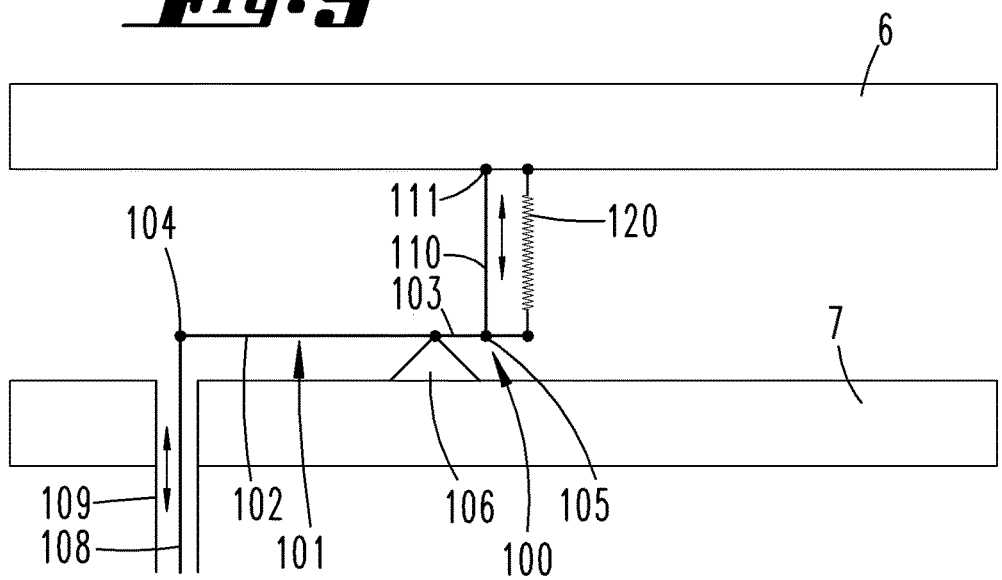

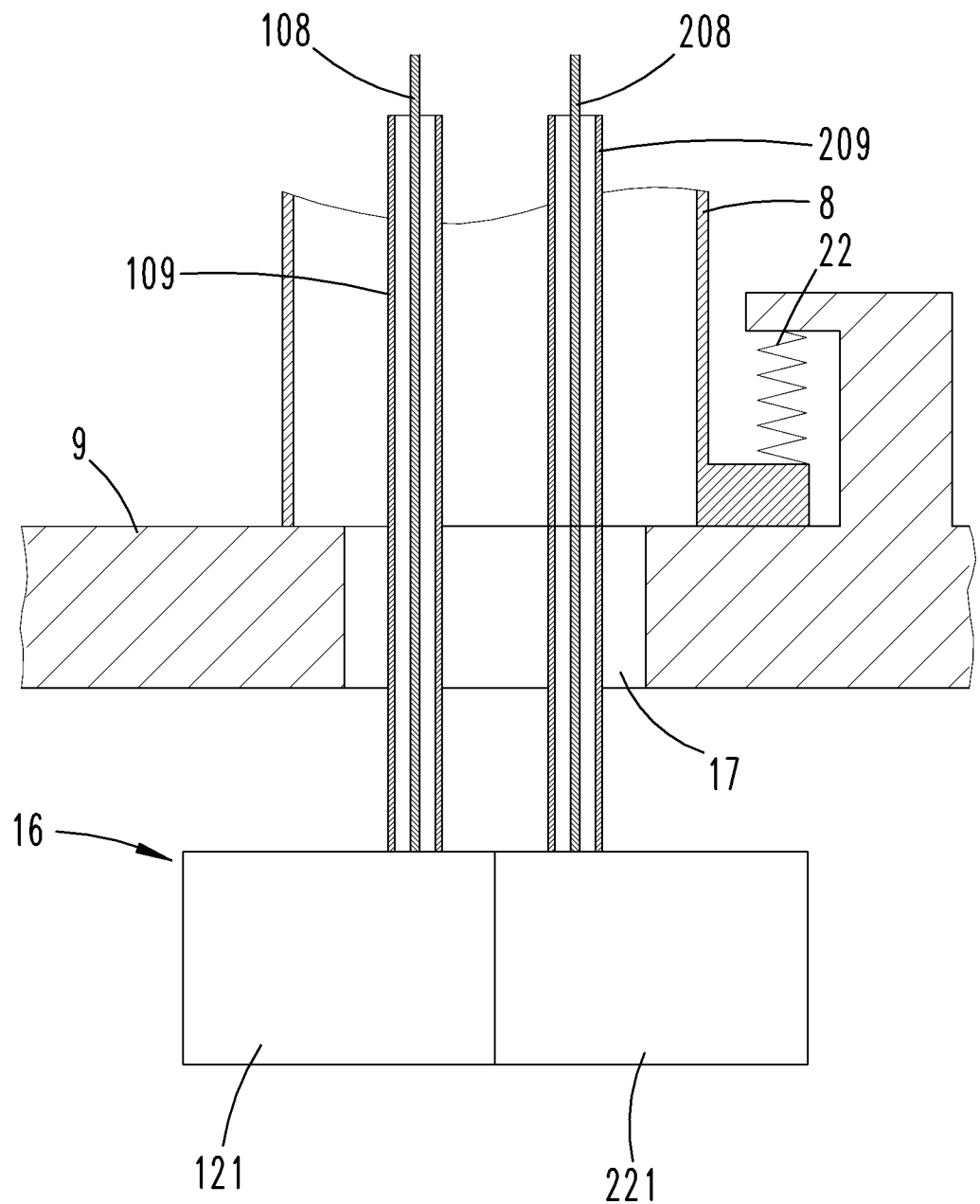

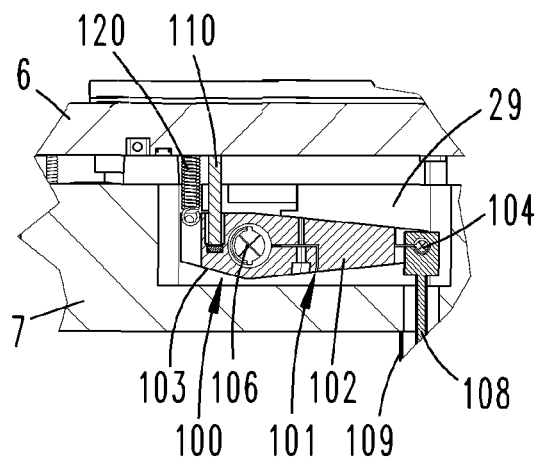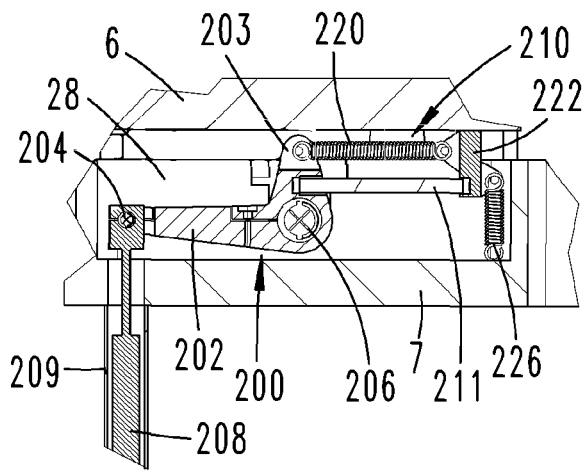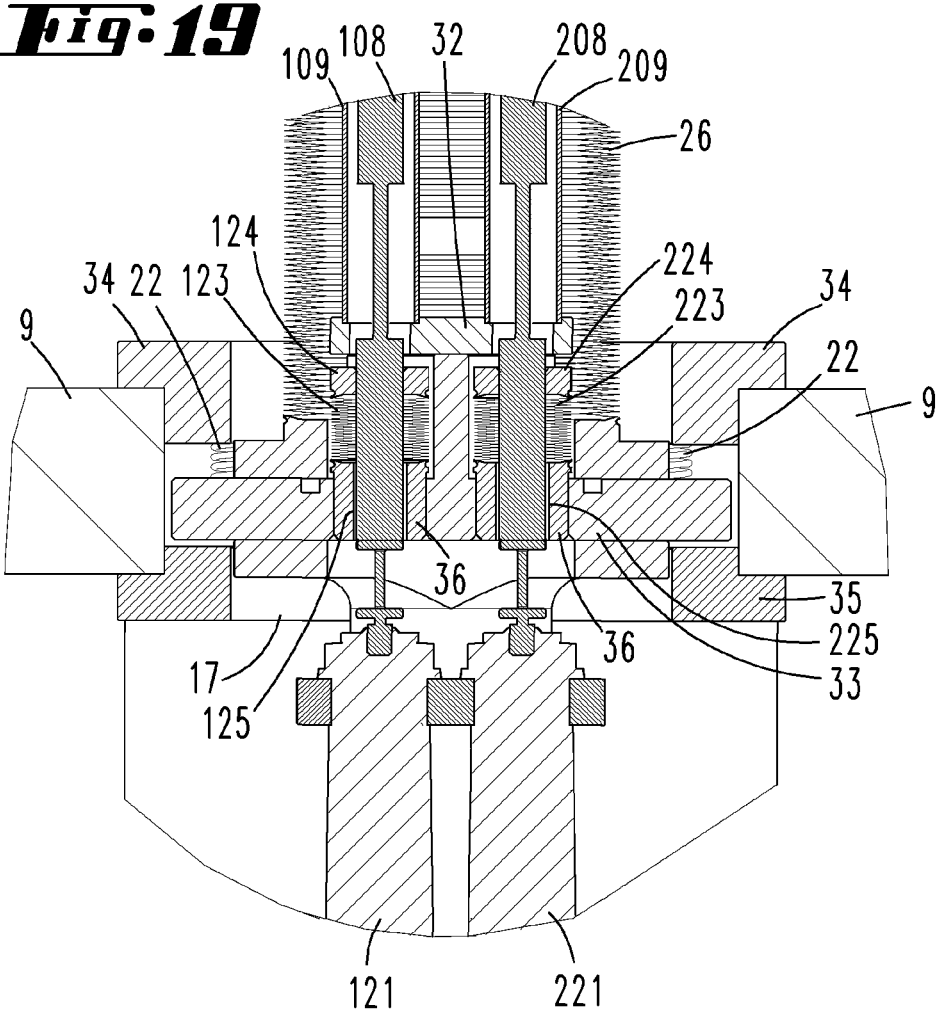

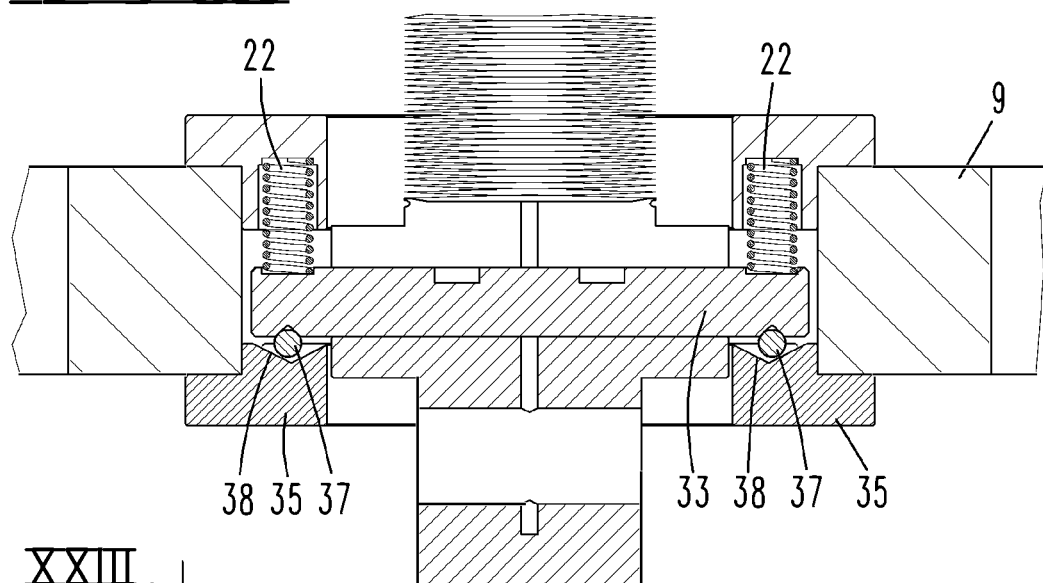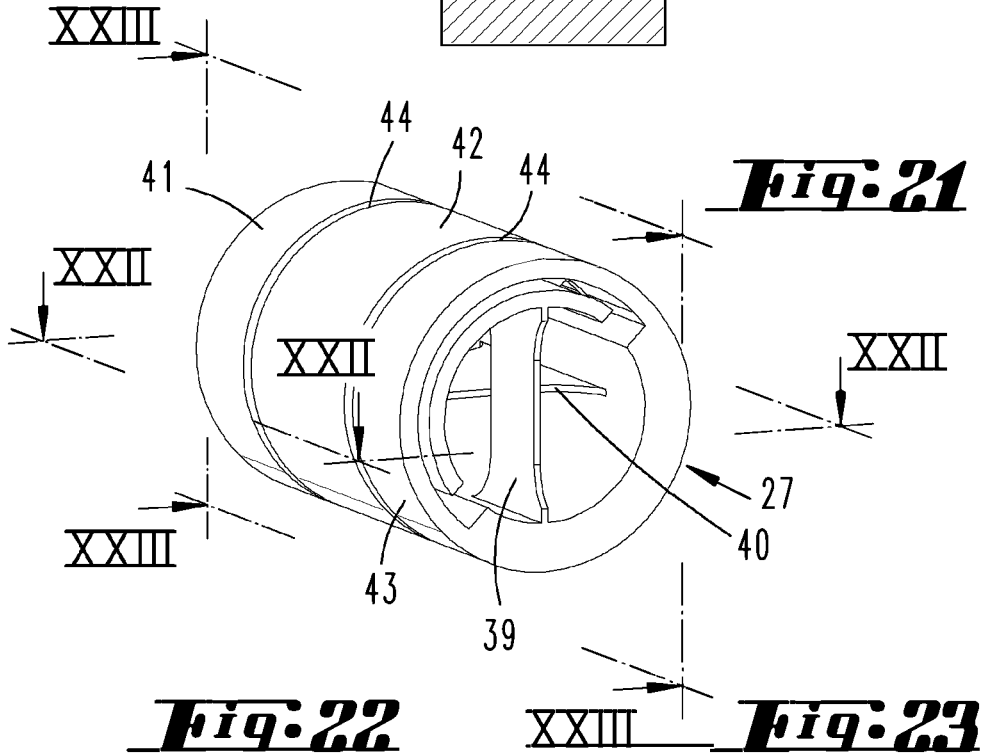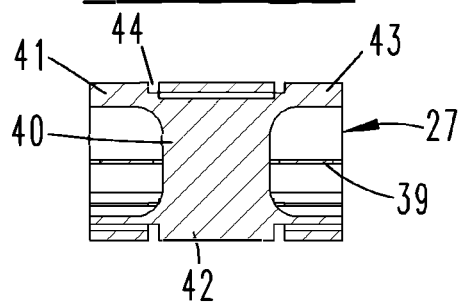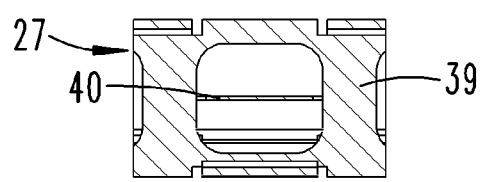

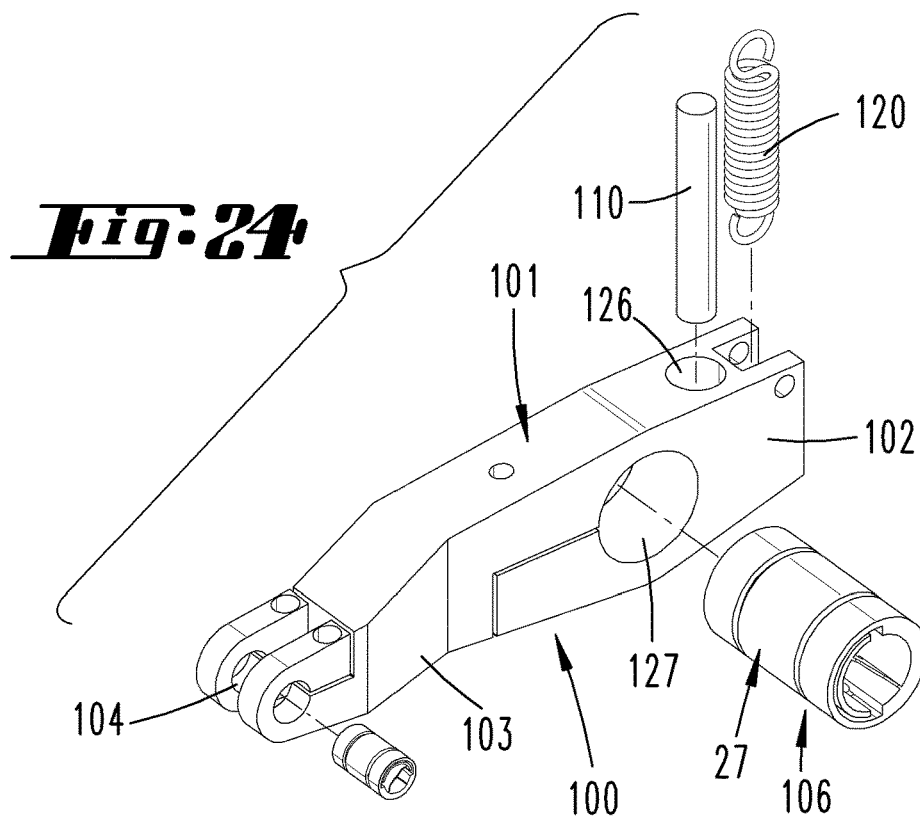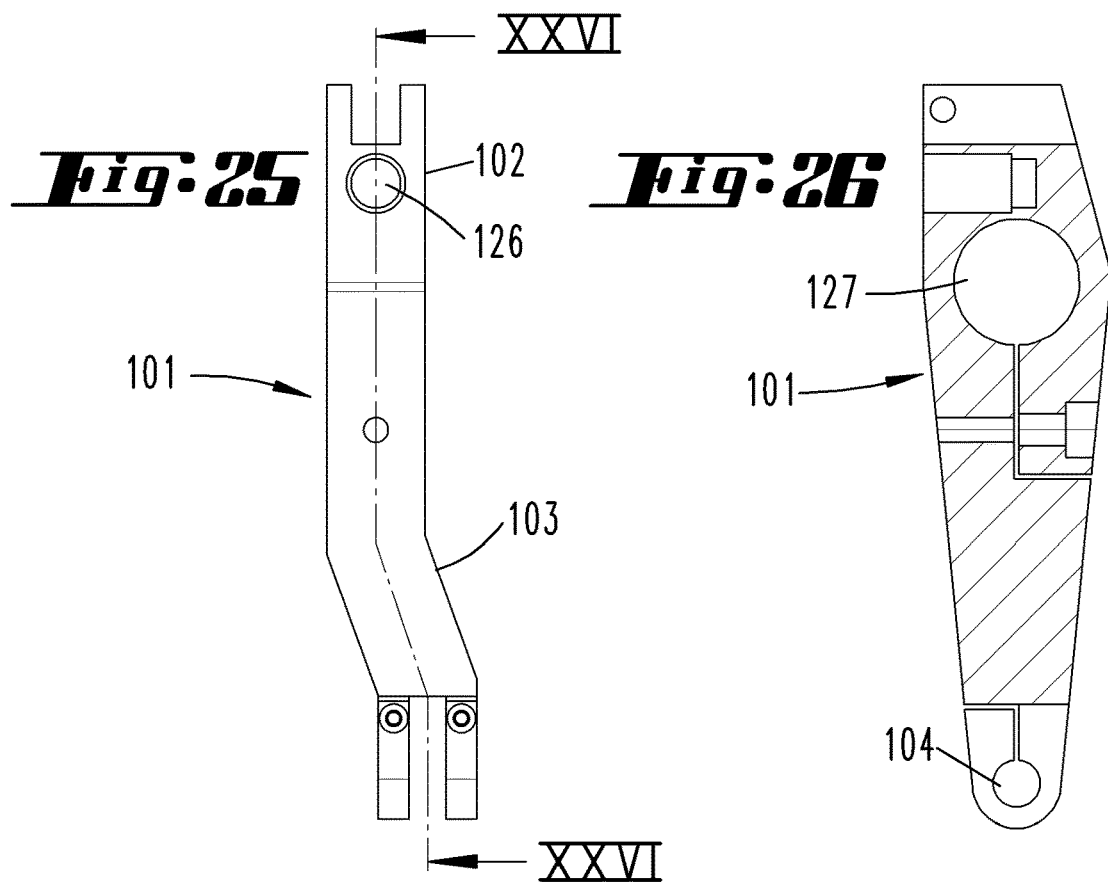

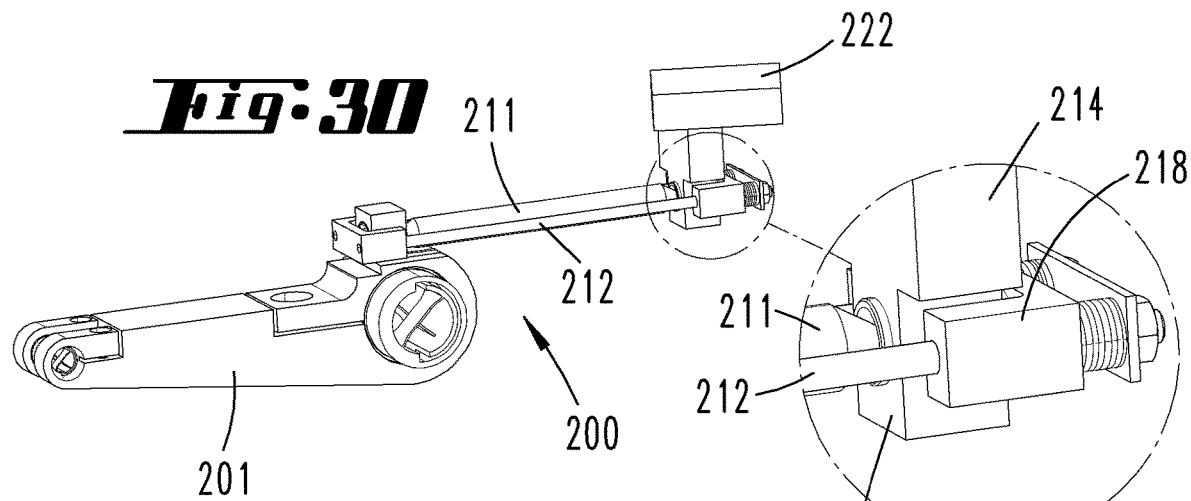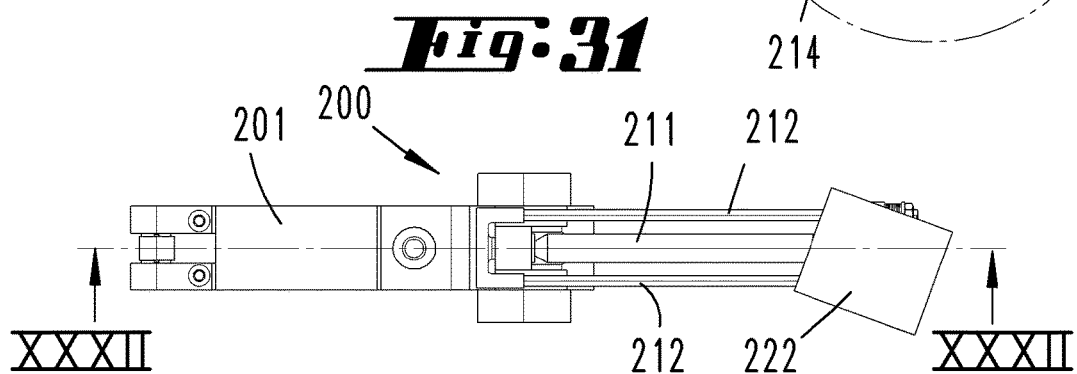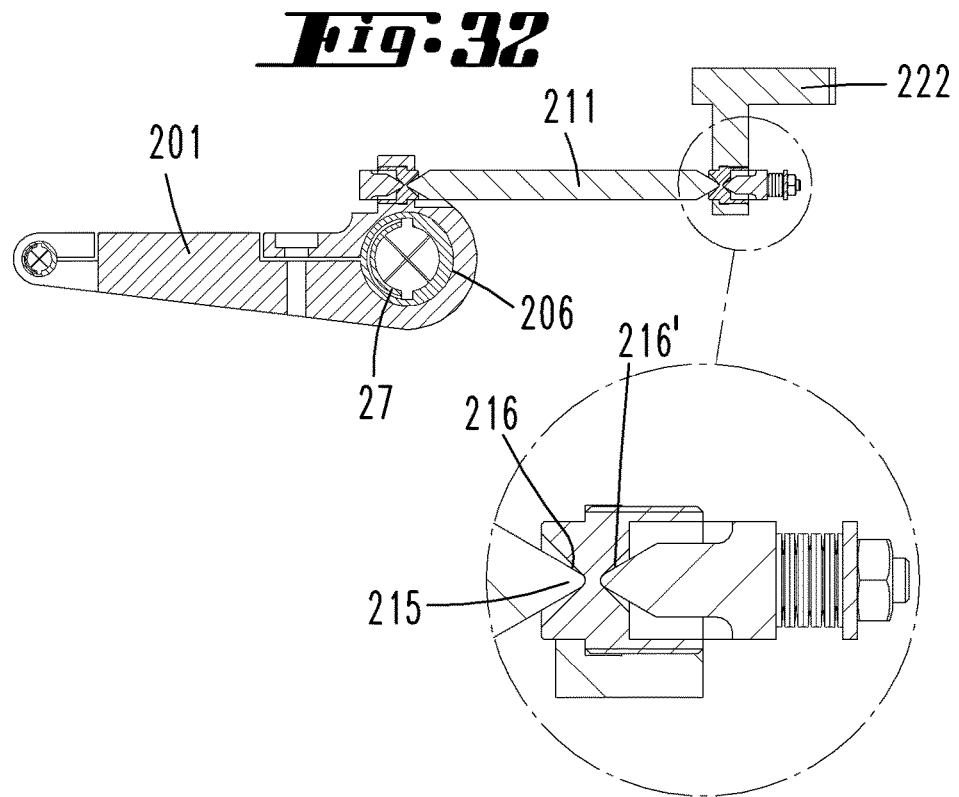

SUBSTRATE HOLDER ARRANGEMENT WITH MASK SUPPORT

RELATED APPLICATIONS

This application is a National Stage under 35 USC 371 of and claims priority to International Application No. PCT/EP2018/056034, filed 12 Mar. 2018, which claims the priority benefit of DE Application No. 10 2017 105 379.4, filed 14 Mar. 2017.

FIELD OF THE INVENTION

The invention concerns a device for the deposition of a layer structured by the application of a mask onto a substrate, with an adjustment device for purposes of adjusting the position of a mask carrier relative to a support frame, with a mask lifting device, with which the support frame with the mask carrier, the adjustment device and a mask arrangement, carried by the mask carrier and comprising the mask, can be brought in the vertical direction from a mask changing position into a processing position, and with a substrate holder lifting device, with which the substrate holder can be brought in the vertical direction from a loading position into a processing position.

BACKGROUND

The inventive device is used for the deposition of OLEDs onto flat substrates, consisting, for example, of glass. Such a device uses a source arrangement, as described, for example, in WO 2012/175128 A1, to convert powdery organic initial materials into a vapor. The vaporized initial materials are transported with a carrier gas to a gas inlet device, as described, for example, in DE 10 2014116 991 A1. The gas inlet device is a showerhead. It has an extended surface, which extends essentially over the entire substrate to be coated. In a gas outlet plane of the gas inlet device, there are a multiplicity of gas outlet openings, through which the vapor enters the process chamber. To avoid condensation of the vapor in the region of the gas inlet device, the gas inlet device is heated. Below the gas inlet device is located the process chamber, the bottom of which is formed by a substrate holder. The substrate lies on the substrate holder. As described in DE 10 2010 000 447 A1, the substrate holder can be brought in a vertical direction from a loading position into a processing position. In the processing position, a mask held by a frame lies on the substrate. It takes the form of a shadow mask, which during the coating process rests in contact on the wide face of the substrate facing the gas inlet device. By this means a structured layer is deposited. The deposition process is essentially a condensation of the vapor on the parts of the surface of the substrate not covered by the mask. For this purpose, the inventive substrate holder is actively cooled, for example, by passing a coolant through it. The cooling of the substrate surface, and also of the mask, takes place by a heat flow from the mask, or from the substrate surface, through the substrate into the substrate holder. When the substrate is changed, the contact between the mask and the substrate is removed, which reduces the heat dissipation and causes the mask to heat up. This causes a distortion of the mask geometry due to the thermal expansion. To avoid this, the aforementioned DE 10 2010 000 447 A1 proposes a shielding plate, which is positioned between the inlet device and substrate holder when changing substrates or masks.

Devices for the vertical displacement of a substrate holder and a support frame for a mask arrangement are also known in the art, for example from WO 2007/023533, KR 2014 0100119, KR 2014 0115484 and WO 2006/090748. The support frame and the substrate holder can essentially be vertically displaced independently of each other, wherein during operation of the device, the support frame of the mask lifting device is firstly vertically displaced from a mask changing position to a processing position by the mask lifting device, and the substrate holder is then displaced from a loading position into a processing position by the substrate holder lifting device. The vertical displacement path can be several decimeters. This long displacement path contrasts with structural dimensions of the mask of a few microns. Due to unavoidable vibrations, and also unavoidable tolerances, reproducible positioning of the substrate holder relative to the support frame is only possible with difficulty. Furthermore, by virtue of the long vertical arms forming the support columns, vertical vibrations of the support frame relative to the substrate holder, and thus of the mask relative to the substrate holder, cannot be avoided.

SUMMARY OF THE INVENTION

The invention is based on the object of specifying measures with which the substrate holder is better stabilized in the processing position relative to the support frame.

The object is achieved by the invention specified in the claims, wherein subsidiary claims are not only advantageous developments of the subordinate claims, but also represent individual achievements of the object. The inventions specified in the subordinate claims can also be combined with each other, wherein in these cases the features not necessary for the purpose in question can also be omitted.

The inventive device is used for the deposition of organic substances on a flat substrate, for example to produce optically active flat elements, such as screens, displays or solar cells. The device has a reactor housing in which there is a gas inlet device, in particular in the form of a showerhead, which is heated to an elevated temperature so that the vaporous initial materials thus introduced into a process chamber do not condense on the gas inlet device. The substrate lies on a substrate holder, which can be moved from a loading position, in which the substrate holder is spaced apart from the showerhead in the vertical direction, to a processing position, in which the substrate holder is arranged at a small vertical distance from the gas outlet surface of the gas inlet device. For purposes of structuring the layer deposited on the substrate, a mask is provided which is carried by a carrier device, wherein the mask carrier device comprises a mask carrier, which carries the mask arrangement, and which can be displaced within the reactor housing in the vertical direction from a mask changing position into a processing position. In the processing position, the mask lies in a contact position on the substrate surface.

The substrate holder is moved from its loading position into the processing position by a separate lifting device. A substrate lifting plate is preferably provided for this purpose, which can be displaced in the vertical direction by a drive device arranged outside the reactor housing. The substrate lifting plate carries a support column. However, there can also be several support columns. The support column is located inside the reactor housing, which is sealed in a gas-tight manner with respect to the external environment. The support frame, which supports the mask arrangement, is also supported by one or more support columns, which are located within the reactor housing, wherein motion transmission means, such as bellows arrangements, are provided so as to displace vertically the support columns from outside the reactor. The motion transmission means are thus gastight motion transmission means. The substrate lifting plate and the mask lifting plate are thus located outside the housing. In accordance with the invention, restraining means are provided, with which the support frame in its processing position is connected to the substrate holder. In particular, the restraining means are configured such that the substrate holder assumes the support function that would otherwise be performed by the support columns of the mask lifting device. When the substrate holder is brought into its processing position, it is connected directly to the support frame by the restraining means, in accordance with the invention. The restraining means can take the form of a V-groove and a spherical surface. The spherical surface is preferably formed by spherical elements, which are locally assigned to the support frame. These spherical elements are supported on the oblique flanks of the V-groove. A statically determined restraint position is achieved by the interaction of three spherical elements with three V-grooves, wherein the vertex lines of the V-grooves preferably intersect at a common point. For the execution of a coating of the substrate, the device is first set up as described below. This can take place without a substrate resting on the substrate holder. For purposes of loading, the substrate holder is loaded with the substrate in a vertically lowered loading position. A preliminary alignment of the substrate takes place during this process. The substrate holder is then raised by means of the substrate lifting device until it grips under the support frame with its restraining means. The mask arrangement can still be in a raised position, so that the mask does not touch the substrate surface. However, it is also possible that the mask will touch the substrate surface when the substrate holder has reached its restraint position relative to the support frame. The substrate holder is raised above this position, but without moving the mask lifting plate. The consequence of this is that the additional lifting motion moves the support frame further away vertically from the mask lifting plate. Since the at least one support column of the mask lifting device is preferably fixed only to the support frame, but not to the mask lifting plate, the lower end of the support column moves away from the mask lifting plate, so that the support column is mechanically decoupled from the mask lifting plate. Vibrations of the mask lifting plate are therefore not transmitted to the support column, and therefore also not to the support frame. It is essential, however, that during the mechanical decoupling the static determination of the mounting of the support frame relative to the substrate holder remains. If necessary, a vertical adjustment device can then be used to lower the mask into the contact position with the substrate. A shield plate, which is arranged in front of the gas outlet surface of the heated gas inlet device during a mask change or substrate change, is removed from the process chamber of the reactor housing before the start of the deposition process. In order to couple the support column of the mask lifting device mechanically in a proper manner again to the mask lifting plate after the deposition process has been completed, spring elements are provided, which hold the detached end of the support column in position.

An adjustment device can be provided. The adjustment device is mounted on a support frame, which supports the mask carrier, on which the mask arrangement rests, wherein the mask arrangement comprises a frame which clamps the mask. The mask frame can be restrained to the mask carrier by suitable means such that it maintains a defined position relative to the mask carrier. The adjustment device preferably has an adjustment lever, which is mounted so that it can rotate about an axis of rotation of a pivot bearing. The adjustment lever has two arms. One arm is engaged with a vertically mounted control rod. The control rod extends through an opening in the reactor housing into a region outside the gas-tight reactor housing, where an actuator is located, with which the control rod can be displaced in its direction of extent. Such an adjustment device can take the form of a vertical adjustment device or a horizontal adjustment device. A preferred device has both a vertical adjustment device and a horizontal adjustment device. By guiding the control rods in control rod guides, there is a certain independence of the position of the actuator unit, which is located at a lower end of the control rod guide. The upper ends of the control rods can be fixedly attached to the support frame, and the lower ends can be fixedly connected to a housing of the actuator unit. The actuator unit preferably contains an actuator for purposes of adjusting the adjustment lever of the vertical adjustment device, and an actuator for purposes of adjusting the adjustment lever of the horizontal adjustment device. The control rods preferably take the form of pull rods, so that it is essential for the control rod guides to transmit pressure to the support frame, or to be attached to the housing of the actuator unit. However, they are also preferably connected to the support frame, that is to say, to the housing of the actuator unit, in a tension-resistant manner, so that the control rod can act as a pull-push rod. The mask lifting plate, on which in particular the support columns for supporting the support frame are supported, can have an opening, through which the control rod guides connected to the actuator unit pass freely. This arrangement makes it possible to displace the support frame relative to the mask lifting plate, in order, for example, to decouple the support column mechanically from the mask lifting plate. Here too, gas-tight motion transmission means are provided, in order to transmit the vertical motion of the actuator, which is arranged outside the reactor housing, to the control rods arranged within the reactor housing. Here too, bellows arrangements are preferably used.

BRIEF DESCRIPTION OF THE DRAWINGS

In what follows, examples of an embodiment of the invention are explained with the aid of the accompanying figures. Here:

FIG. 8 shows in a schematic manner a prismatic joint 210;

FIG. 9 shows in a schematic manner an adjustment lever 101 of a vertical adjustment device 100;

FIG. 10 shows at an enlarged scale the detail X in FIG. 1;

FIG. 17 shows at an enlarged scale the detail XVII in FIG. 16;

FIG. 18 shows at an enlarged scale the detail XVIII in FIG. 16;

FIG. 19 shows at an enlarged scale the detail XIX in FIG. 16;

FIG. 20 shows at an enlarged scale the area shown in FIG. 19, but along the line of cut XX-XX in FIG. 14;

FIG. 21 shows, in a perspective view, a leaf spring 27 to form a pivot bearing 106, 206;

FIG. 22 shows the cross-section along the plane XXII in FIG. 21;

FIG. 23 shows the cross-section along the plane XXIII-XXIII in FIG. 21;

FIG. 24 shows in an exploded perspective view a vertical adjustment device 100;

FIG. 25 shows the plan view onto the adjustment lever 101;

FIG. 26 shows the cross-section along the line XXVI-XXVI in FIG. 25;

FIG. 30 shows a horizontal adjusting device of a second example of an embodiment;

FIG. 31 shows the plan view onto the horizontal adjustment device in FIG. 30; and FIG. 32 shows the cross-section along the line XXXII-XXXII in FIG. 31.

DETAILED DESCRIPTION

Figure 1:
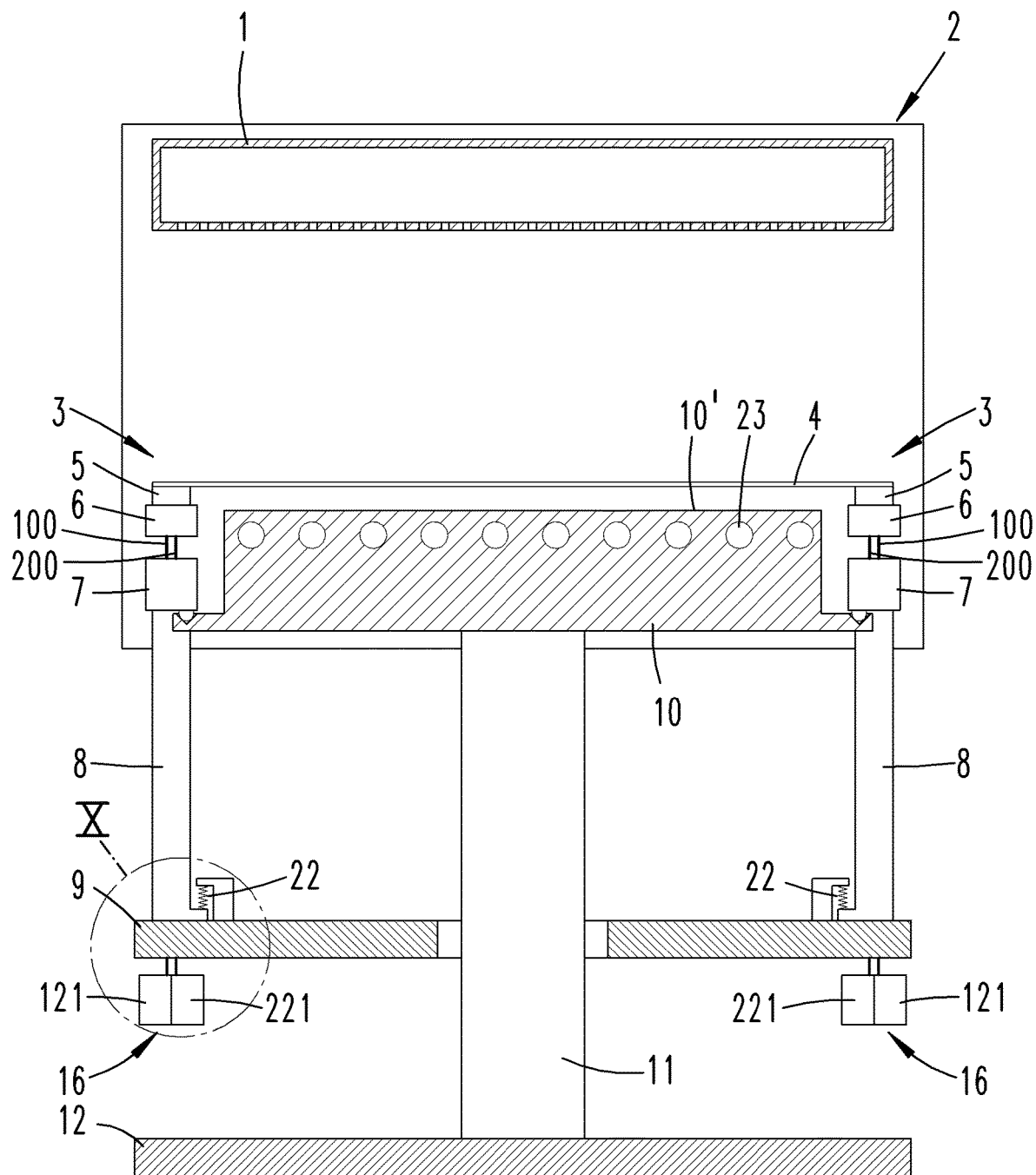
FIG. 1 shows in a highly schematic manner, and for purposes of clarification of the essential constructive elements and their interaction, in the manner of a vertical cross-section, an example of an embodiment of a device, in which a mask lifting device is located in a mask changing position, and a substrate holder lifting device is located in a loading position.

FIGS. 1-12 show in a schematic manner some details relevant to the explanation of the operation and structure of an inventive device, which are explained below:

A reactor housing 2 made of steel is sealed in a gas-tight manner with respect to the external environment, and can be evacuated. A vacuum pump (not shown here) is provided for this purpose. In addition, the reactor housing 2 has closable openings, through which a mask arrangement 3, consisting of a mask 4 and a mask frame 5, can be inserted into the reactor housing 2. The wall of the reactor housing 2 also has an opening (not shown), through which it can be loaded with substrates.

A vertically displaceable substrate lifting plate 12 is mounted on a frame (not shown), which can carry the reactor housing 2. The substrate lifting plate 12 carries a support column 11, which protrudes into the reactor housing 2 through an opening. There it carries a substrate holder 10, which has cooling channels 23, through which coolant can flow to cool the substrate support surface of the substrate holder 10. Motion transmission means, e.g. a bellows, can be provided to allow the support column 11 to operate in a gas-tight manner through an opening in the reactor housing 2.

Vertically above the substrate holder 10 there is a gas inlet device 1 in the form of a showerhead which may have unrepresented heating elements to heat the gas inlet device 1 to a temperature at which the vapor of organic raw material introduced through the gas inlet device into a process chamber below does not condense.

Outside the reactor housing 2 there is also located a mask lifting plate 9, which can also be displaced in a vertical direction. The support column 11 can pass through an opening in the mask lifting plate 9. Here, too, suitable motion transmission means can be provided to transmit the motion of the mask lifting plate 9 in a gas-tight manner into the reactor housing 2. The mask lifting plate 9 carries support columns 8, which protrude through openings into the reactor housing 2. At their upper ends, the support columns 8 support the support frame 7, in which three vertical adjustment devices 100 and three horizontal adjustment devices 200 are arranged. In FIGS. 1-6 these are only represented symbolically, and in FIGS. 7-9 only symbolically in terms of function.

The lower ends of the support columns 8 are simply supported on the mask lifting plate 9. They are connected to the mask lifting plate 9 with a spring element 22 such that they can move away from the mask lifting plate 9 in the vertical direction, so that the gap 14 shown can be adjusted. The support columns 8 are then decoupled from the mask lifting plate 9.

The support columns 8 are hollow. Control rod guides 109 extend in the cavities of the mask support columns, for a control rod 108 of the vertical adjustment device, and control rod guides 209 for control rods 208 of the horizontal adjustment device 200. One control rod guide 109 and one control rod guide 209 in each case pass through an opening 17 of the mask lifting plate 9, and their lower ends are connected to a housing of an actuator unit 16. The actuator unit 16 is thus not directly connected to the mask lifting plate 9. In the actuator unit 16 is located a first actuator 121 for purposes of displacing the control rod 108 in the control rod guide 109, and a second actuator 221 for purposes of displacing the control rod 208 in the control rod guide 209.

The vertical adjustment device 100 has the adjustment lever 101, which in each case has a pivot bearing 106. The axes of rotation 107 of the pivot bearings 106 intersect at the point P1 (see FIG. 6), which lies in the plane surrounded by the support frame 7.

The horizontal adjustment device 200 has three adjustment levers 201, which are arranged approximately where the three adjustment levers 101 are also located. The adjustment levers 201 can also be rotated about a pivot bearing 206. The axes of rotation 207 of the pivot bearings 206 intersect at the point P2. The positions of the points P1 and P2 can in principle be arbitrary. Preferably, however, the points P1 and P2 are almost coincident. The axes 107, 207, shown as dot-dash lines in FIG. 6, preferably subtend an angle α of 120°. However, the angle can also be in a range between 100 and 160°.

Figure 7:
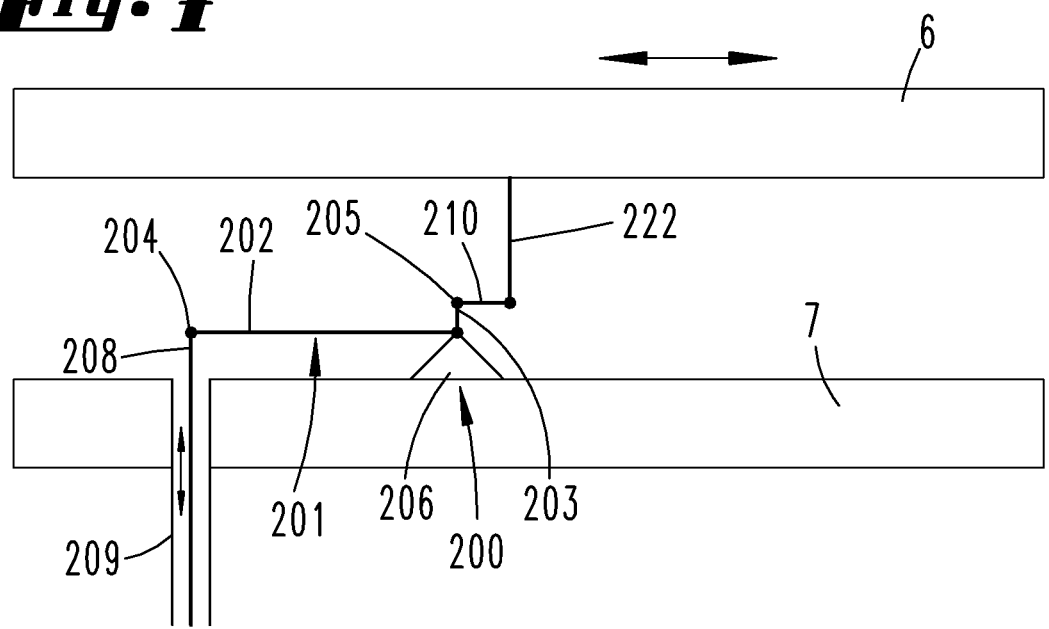
FIG. 7 shows in a schematic manner an adjustment lever 201 of a horizontal adjustment device 200.

FIG. 7 shows in a schematic manner the structure of a single element of a horizontal adjustment device 200. A pivot bearing 206, which is fixedly connected to the support frame 7, supports, in particular without play, the adjustment lever 201, which is here designed as an angle lever, using a leaf spring bearing. A long lever arm 202, which is about five times as long as a short lever arm 203, extends in a horizontal direction, whereas the short lever arm 203 extends in a vertical direction. The control rod 208 is articulated at an articulation point 204 at the free end of the long arm 202, and can be moved in the vertical direction within the tubular control rod guide 209. At the free end of the short arm 203, a link arm 210 is articulated at an articulation point 205, which in turn is articulated at a pillar 222, which is fixedly connected to the mask carrier 6.

If the control rod 208 is displaced in the vertical direction, the adjustment lever 201 is rotated about its pivot bearing 206, which leads to a displacement of the articulation point 205 on the short arm 203, to a horizontal motion in the direction of the double arrow of FIG. 7. This horizontal motion is transmitted to the mask carrier 6 via the rigid pillar 222.

FIG. 8 shows an example of a preferred design of the link arm 210. With the end pieces 213 and 214 the link arm is connected to the articulation point 205 of the short arm 203 and the pillar 222. The sides of the end pieces 213, 214 facing each other have recesses 216, in which the points 215 of a push rod 211 facing away from each other are supported. The recesses 216 each have a cup-shaped lowest point in which the tip 215 is supported. The end pieces 213, 214 also have recesses 216' on their opposite sides, in which support elements 217, 217' are supported. The support elements 217, 217' are connected to each other by means of tensile members 212. Here these take the form of pull rods, which are attached at one end to the support element 217. Their other ends pass through a passage 218 of the other support element 217'. On the opposite side to the tip, spring elements 220, penetrated by the tensile members 212, which here are compression springs, are supported on the support element 217' by the tensile members 212; these in turn are acted upon by a connecting piece 219, to which the ends of the tensile members 212 are attached, so that the spring elements 220 form a tensile force which holds the tips 215 in the recesses 216 that are assigned to them.

FIG. 9 shows in a schematic manner the construction and bearing arrangement of an adjustment lever 101 of an element of the vertical adjustment device 100. It takes the form of a two-armed lever with a long lever arm 102, which is about five times as long as a short arm 103. The two arms 102 and 103 extend in the horizontal direction at a 180° angle. However, they can also extend at an angle of 90° to each other. At the free end of the long lever arm 102, a control rod 108, which is guided by the tubular control rod guide 109, is articulated at an articulation point 104. At the free end of the short arm 103, a push rod 110, which engages under the mask carrier 6, is articulated at an articulation point 105. The push rod 110 engages with the mask carrier 6 at an articulation point 111 in a sliding or articulated manner. If the control rod 108 is displaced in the vertical direction, this vertical displacement is reduced into a vertical displacement of the push rod 110. In addition, an optional spring element 120 is provided, which applies an additional tensile force in the vertical direction to the mask carrier 6 in the case of a simple sliding connection of the push rod 110 to the mask carrier 6.

Figure 11:
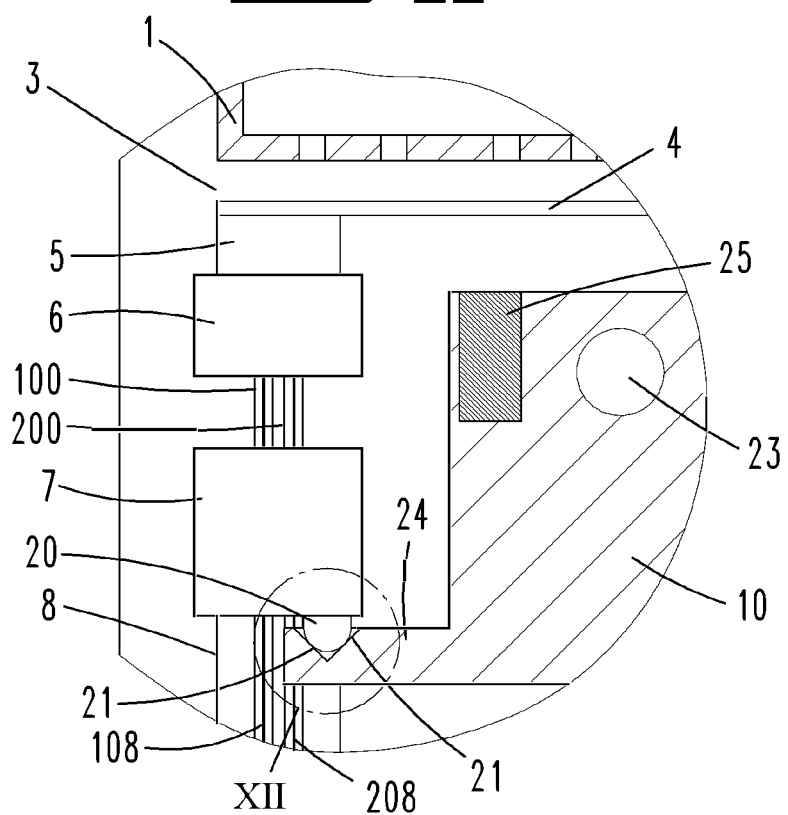
FIG. 11 shows at an enlarged scale the detail XI in FIG. 4.
Figure 12:
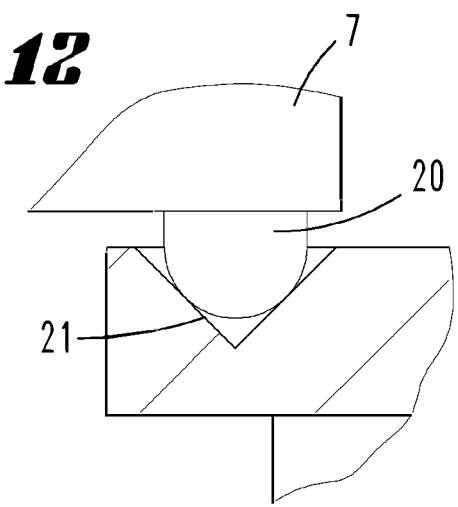
FIG. 12 shows at an enlarged scale the detail XII in FIG. 11.

FIGS. 11 and 12 show an upper part of the substrate holder 10. The substrate holder 10 has a restraining element 24 in the form of a V-groove. The V-groove 21 is shown here only in a schematic manner. It is assigned to a projection 24. A total of three V-grooves 21 are provided. The vertex lines of the V-grooves 21 intersect at a common point. The V-grooves 21 extend in a horizontal plane. The V-grooves 21 are open at the top.

The mask frame 7 has a ball on its underside which forms a ball surface 20 which is supported on the flanks of the V-groove. With this restraining means, formed by the V-groove 21 and the spherical surface 20, the support frame 7 can be directly supported in a statically determinate manner by the substrate holder 10. The result is a rigid and, in particular, a vibration-resistant, connection between the substrate holder 10 and the support frame 7. The support frame 7 is mechanically rigidly coupled to the mask holder 6 carrying the mask frame 5 by way of the adjustment levers 101 and 201.

The set-up of a device after a mask change is preferably carried out with the following steps:

In the position shown in FIG. 1, both the substrate holder 10 and the mask carrying device formed by the support frame, the mask carrier 6, and the adjustment devices 100, 200 each occupy a change position. A substrate can be positioned on the upper face of the substrate holder 10, which forms a support surface 10'. Another mask with its mask frame 5 can be placed on the mask carrier 6. The thin mask 4, which has openings, is stretched over the mask frame 5 so that it extends approximately in one plane.

Figure 2:
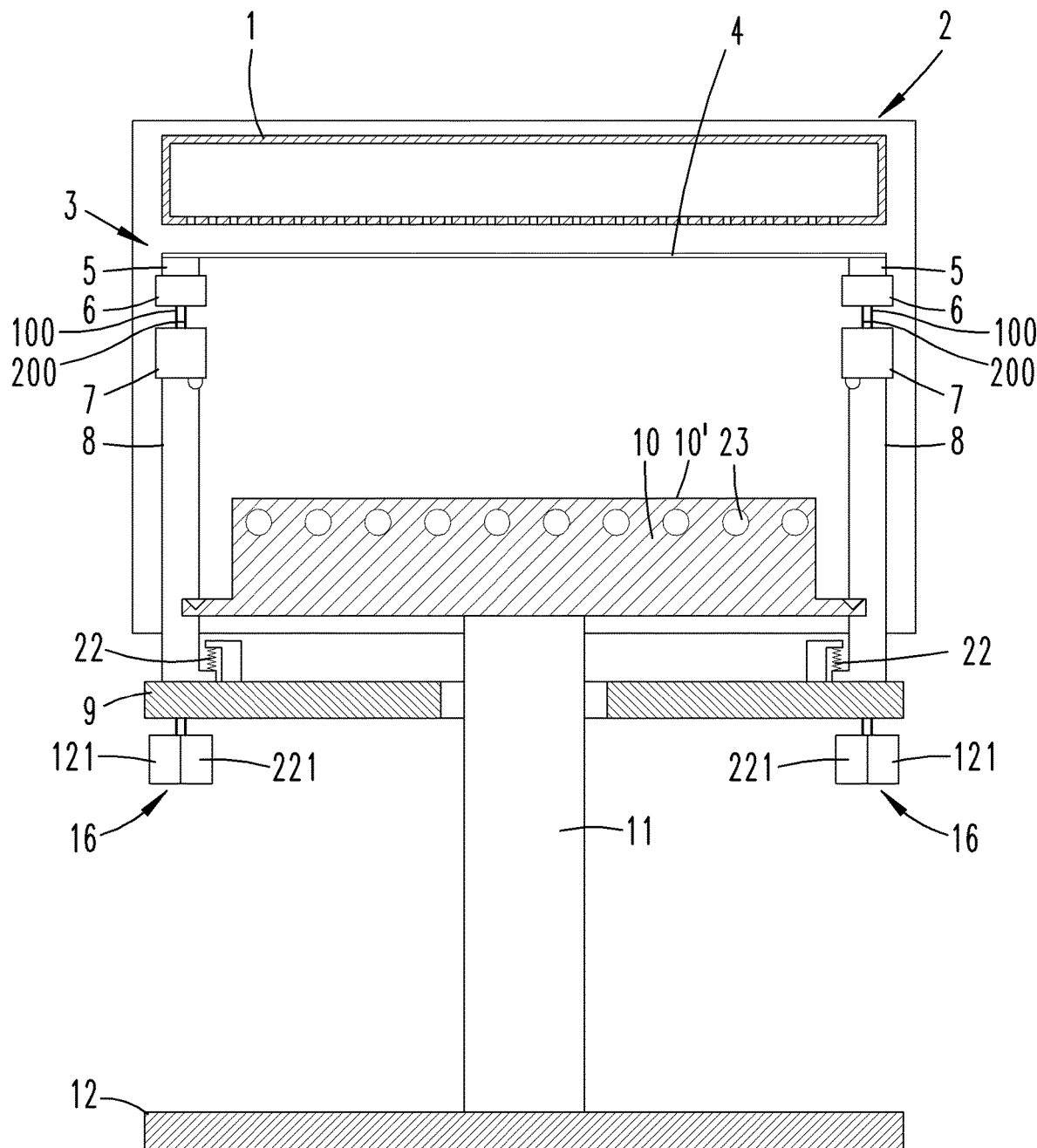
FIG. 2 shows an illustration as in FIG. 1, but with the mask lifting device displaced into a processing position.

A mask carrier 6, provided with an exchanged mask arrangement 3, is moved upwards by displacing the mask lifting plate 9 into the processing position shown in FIG. 2.

Figure 3:
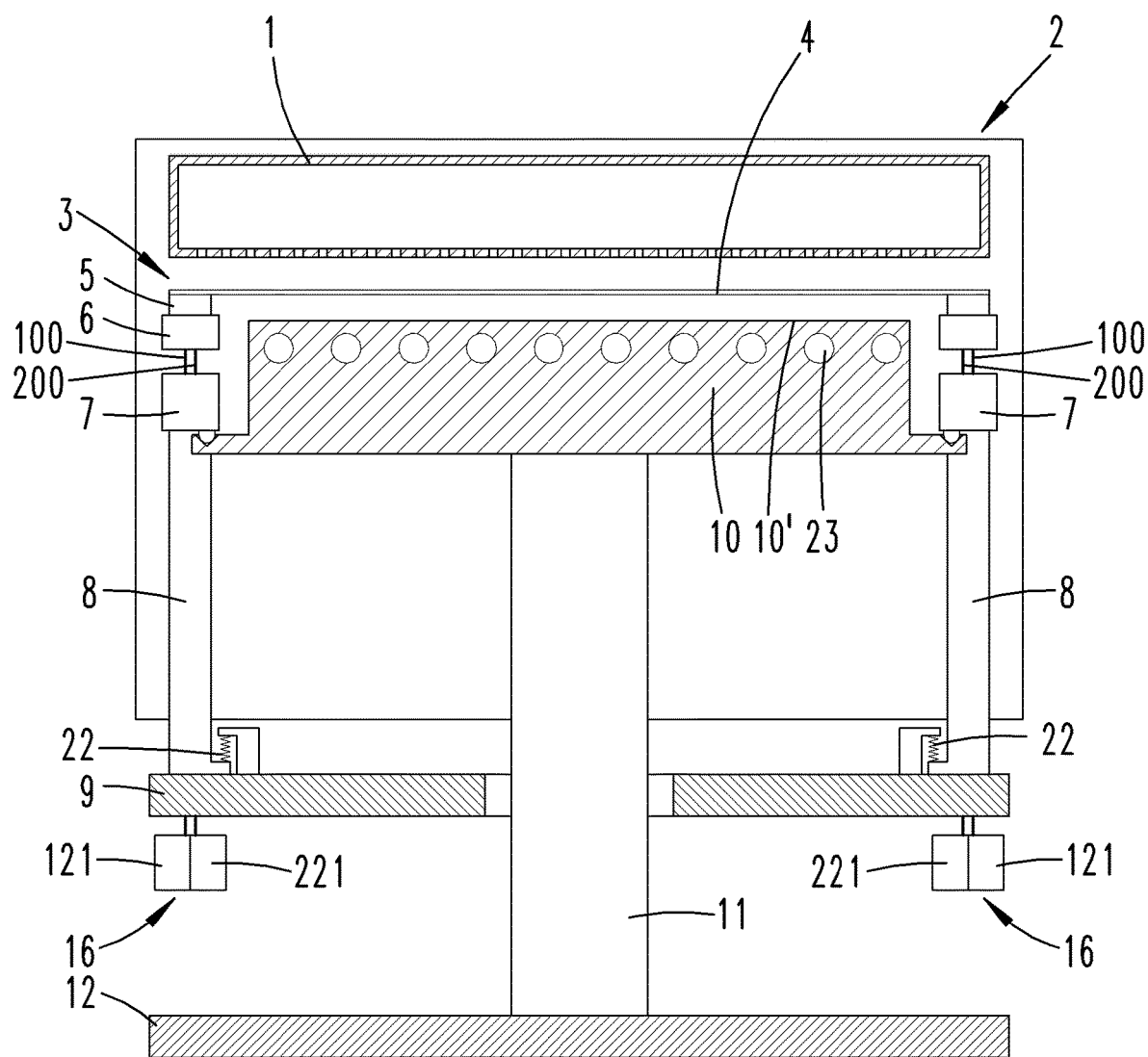
FIG. 3 shows a subsequent illustration to FIG. 2, but with the substrate lifting device displaced into a processing position.

By a displacement of the substrate lifting plate 12, the substrate holder 10 is then brought upwards into a position in which the spherical surfaces 20 are not yet supported in the V-slots 21, as shown in FIG. 3.

Figure 4:
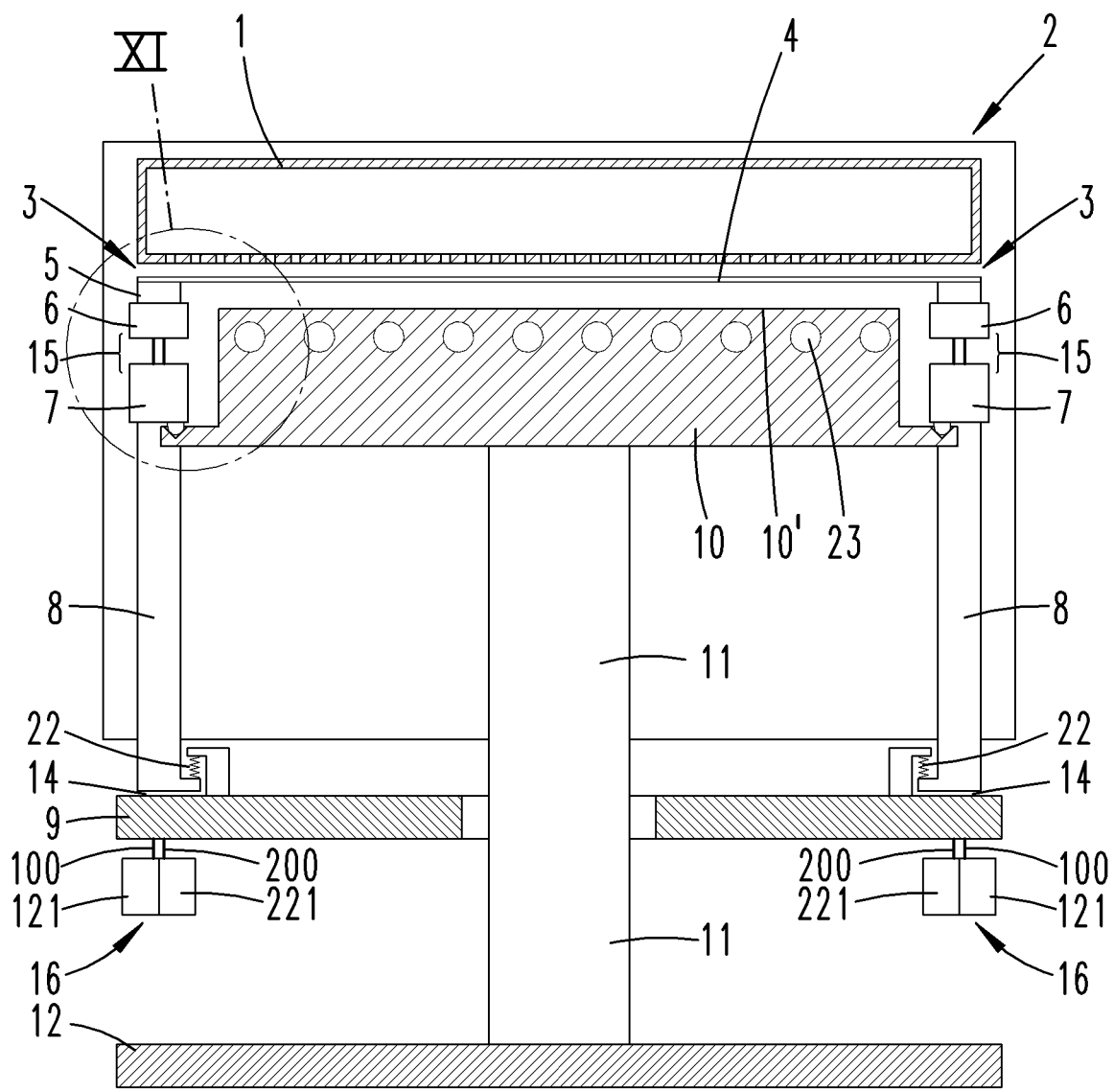
FIG. 4 shows a subsequent illustration to FIG. 3, wherein a substrate lifting plate 12 is slightly raised, or a mask lifting plate 9 is slightly lowered, such that a gap 14 is formed.
Figure 5:
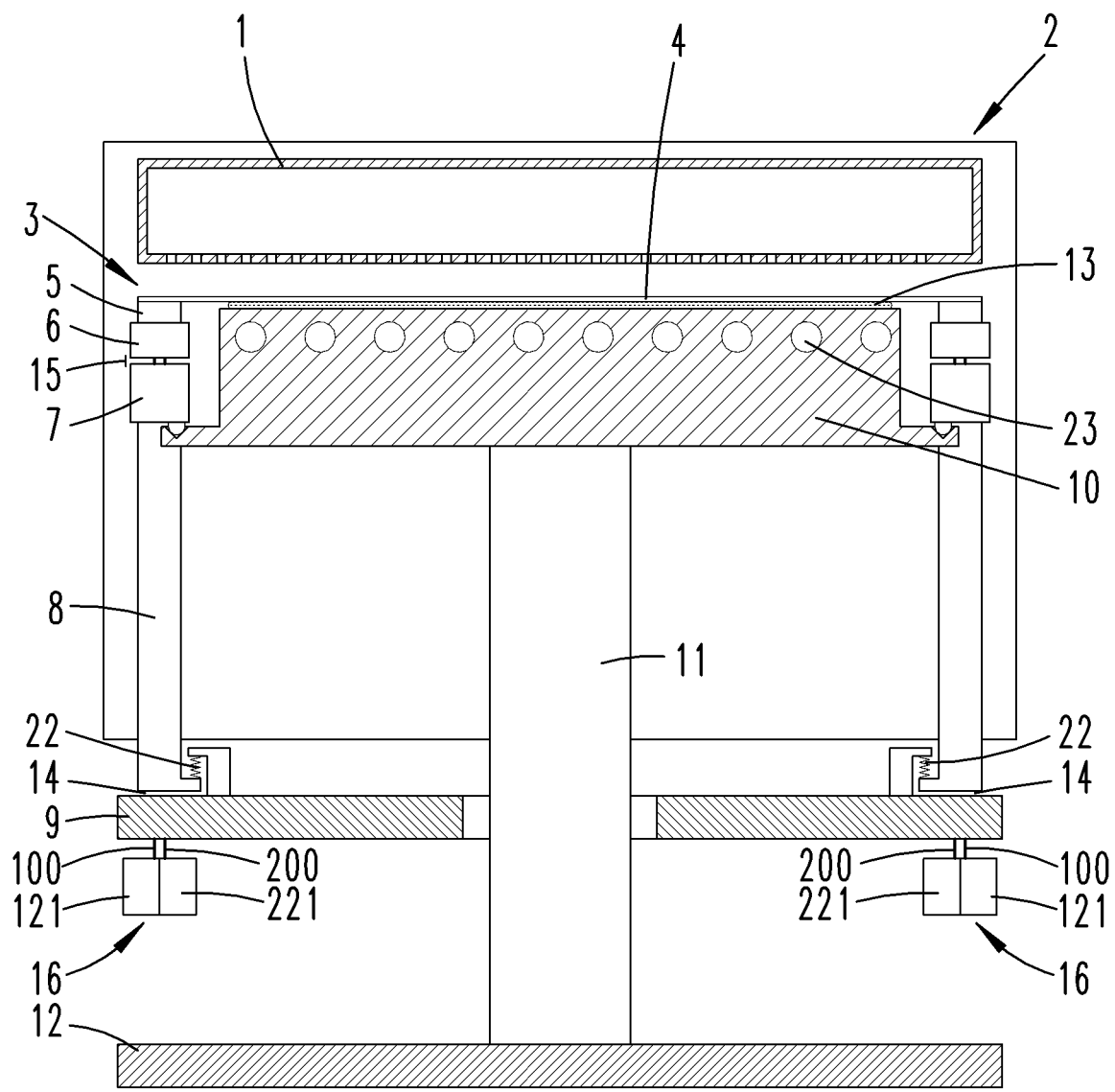
FIG. 5 shows a subsequent illustration to FIG. 4, but after the loading of the substrate holder 10 with a substrate 13, and the bringing of the substrate holder 10 into a processing position, and the lowering of the mask 4 onto the substrate surface of the substrate 13 to be coated.
Figure 6:
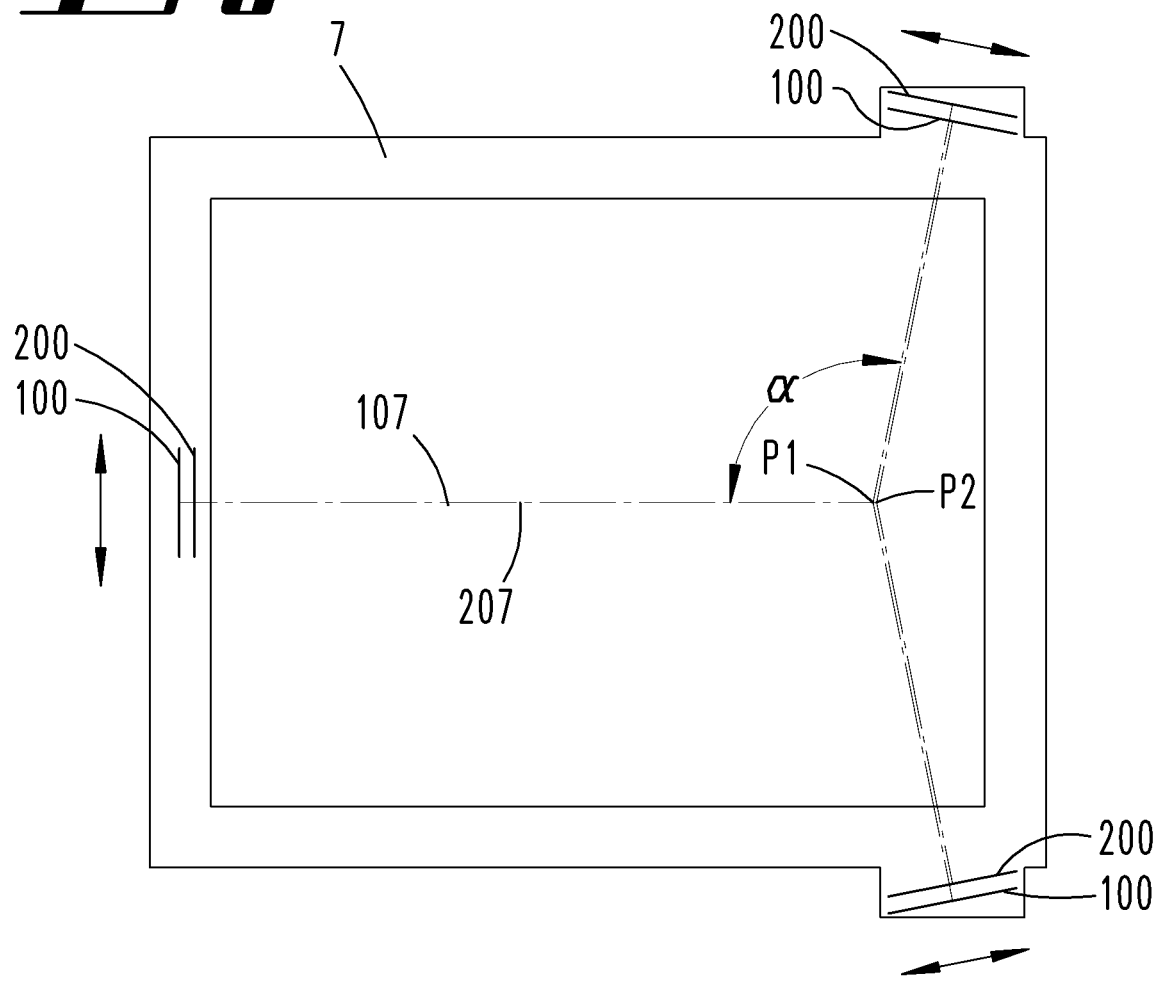
FIG. 6 shows in a schematic manner a plan view onto the support frame 7 to illustrate the arrangement of vertical adjustment devices 100 and horizontal adjustment devices 200, with which the horizontal position and the vertical position of a mask carrier 6 can be adjusted in relation to the support frame 7.

The substrate holder 10 is then displaced upwards relative to the mask lifting plate 9, or the mask lifting plate 9 is displaced slightly downwards. With this relative displacement between the substrate lifting plate 12 and the mask lifting plate 9, the spherical surfaces 20 enter into the V-slots 21. The distance between the mask lifting plate and the support frame 7 increases. Since the support columns 8 are not connected to the mask lifting plate 9 in a tension-resistant manner, a gap is formed between the support columns 8 and the mask lifting plate 9, as indicated in FIG. 4 with the reference number 14. The support frame 7 is no longer supported by the mask lifting plate 9, but solely by the substrate holder 10, in particular at the three support points at which a spherical surface 20 is in each case supported on the flanks of the V-groove 21.

In a next step, in an operating position as shown in FIG. 4, the vertical distance between the edge of the mask 4 and the substrate holder 10 is determined by means of a distance sensor 25, shown in FIG. 11, which can take the form of a proximity switch, at at least three locations, preferably at the three locations at which an element of the vertical adjustment device 100 is located. Using the adjustment lever 101 of the vertical adjustment device 100, the vertical distances are altered until they are equal. The mask 4 then lies parallel to the substrate holder 10.

In a variant of the invention, however, provision can also be made for the distance sensor 25 to be attached to the support frame 7.

After the mask 4 has been brought into a position that is parallel to the upper face 10' of the substrate holder 10, the substrate holder 10 can be lowered back into its loading position (FIG. 2) in order to be loaded with a substrate 13. It is then brought into the processing position, wherein mask 4 at first still has a small separation distance of, for example, 0.5 mm, from the upper face of the substrate 13. The mask 4 can be adjusted in the horizontal direction relative to the substrate 13 by means of the horizontal adjustment device 200 and an imaging adjustment aid (not shown). For this purpose, alignment marks of the mask (not shown in the figures) are brought into coincidence with alignment marks of the substrate (also not shown). By means of the adjustment lever 101, and the articulated connection of the respective short arms 103 with the mask carrier 6, the mask carrier 6 can not only be moved linearly in the plane. It can also be rotated. Adjustment aids can have lasers, which are attached to the substrate holder, and whose laser beams are directed in the direction onto the mask.

Figure 13:
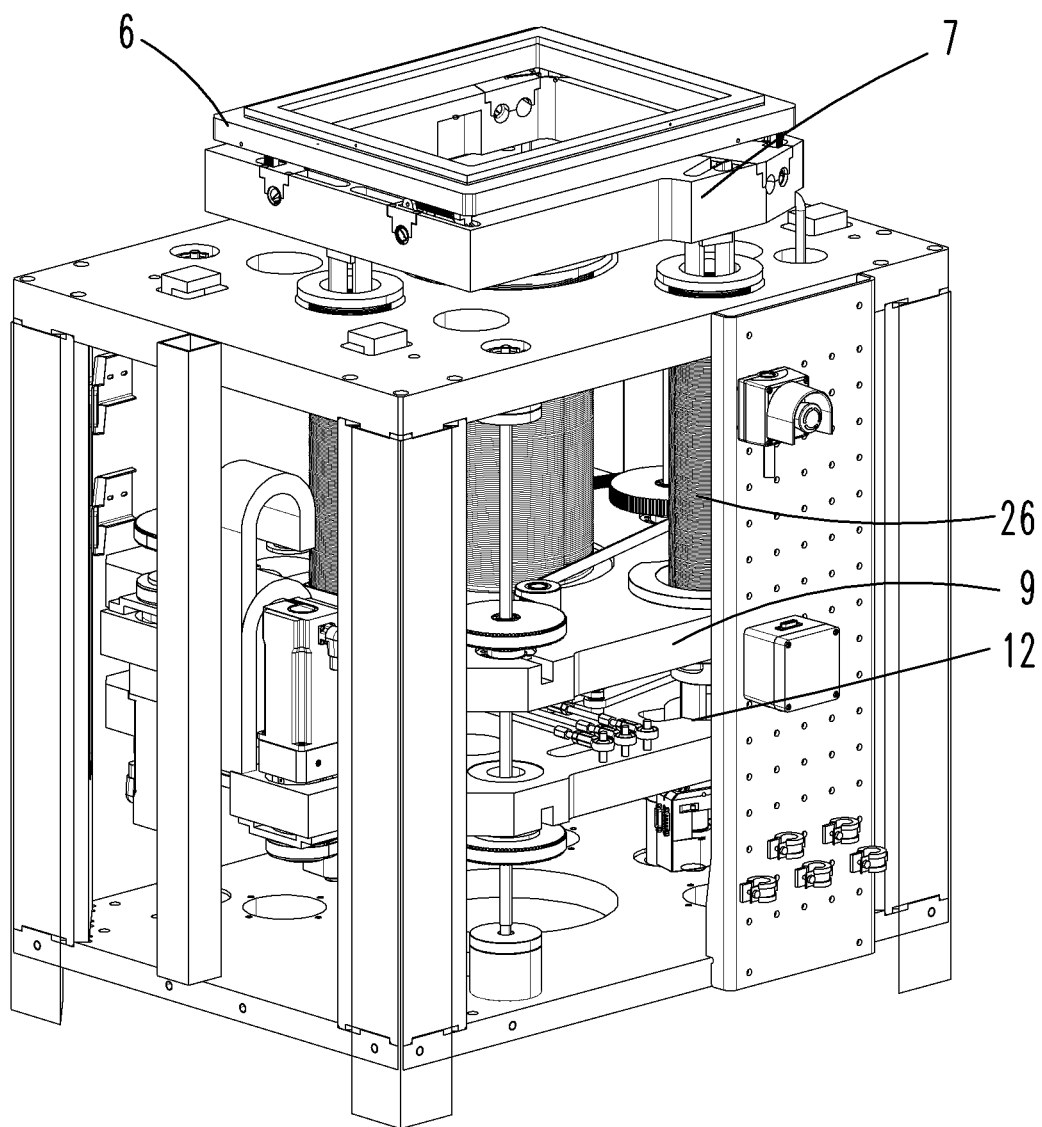
FIG. 13 shows in a perspective view an underframe of a device according to the invention.

FIGS. 13-32 show details of an inventive device for depositing organic molecules on a substrate. In a perspective view, FIG. 13 shows a base frame, with a frame in which a mask lifting plate 9 and a substrate lifting plate 12 can be displaced essentially independently of each other in the vertical direction. Electrical drives are provided for the displacement of the mask lifting plate 9 and the substrate lifting plate 12. With the mask lifting plate 9 a support frame 7 can be displaced vertically, which carries a mask carrier 6, which in turn carries a mask frame 5, to which is attached a shadow mask (not shown). The shadow mask is clamped relative to the mask frame 5 such that it sags only slightly in the vertical direction. The substrate holder, and a substrate resting on it, are hidden in this illustration, as is the gas-tight reactor housing.

Figure 14:
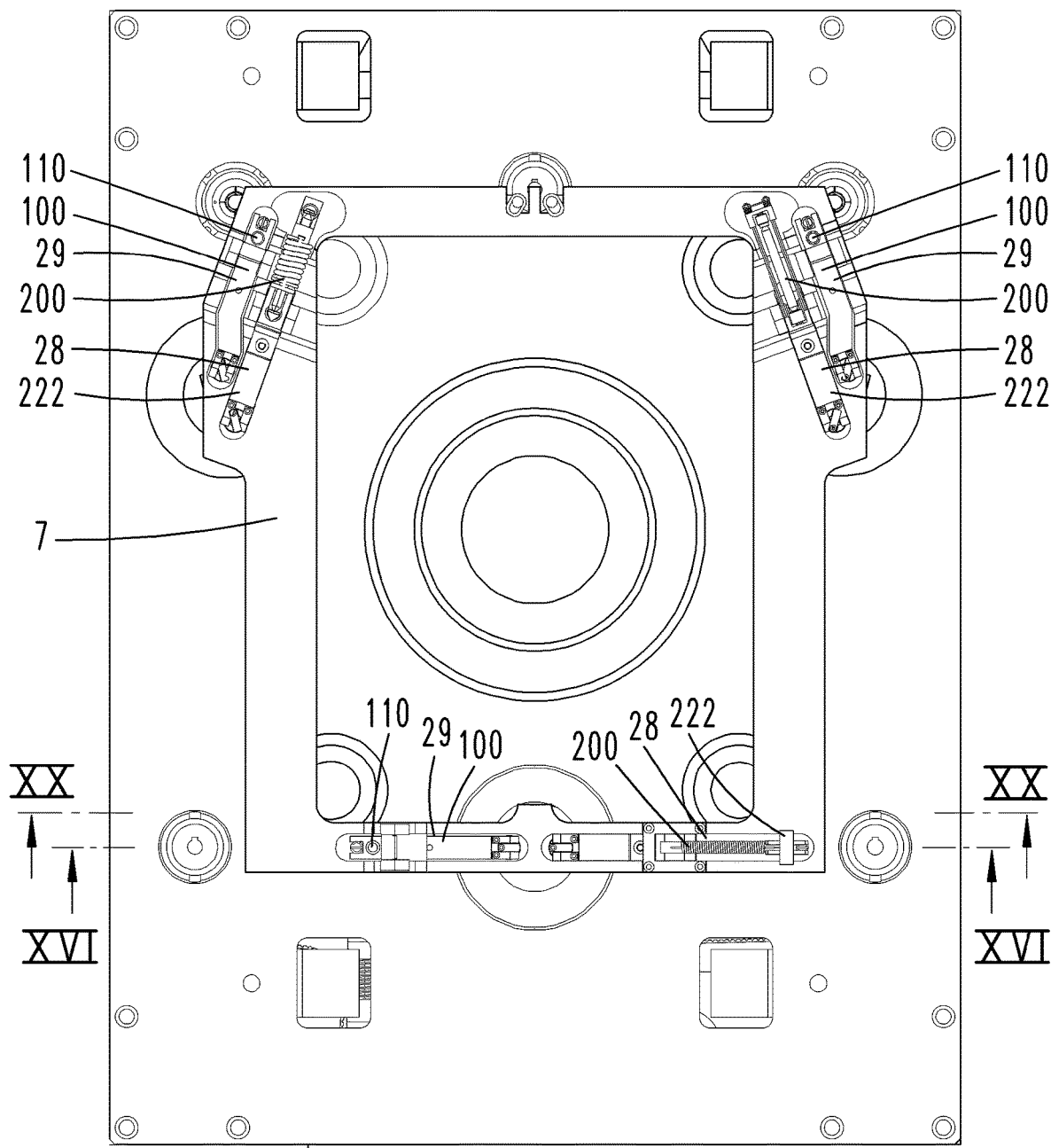
FIG. 14 shows a plan view onto the support frame 7, and adjusting devices 100, 200 arranged in pockets of the support frame 7.

FIG. 14 shows the plan view onto the support frame 7 with the mask carrier 6 broken away. The support frame 7 has a rectangular outline, and pockets 28, in which horizontal adjustment devices 200 are arranged. The pockets 28 are open at the top, as are the pockets 29, in which vertical adjustment devices 100 are arranged. The vertical adjustment devices 100 in each case have a push rod 110. The push rods 110 are arranged at the points of a triangle. The horizontal adjustment device 200 has a pillar 222, which can be displaced in the horizontal direction. The pillars 222 are also arranged at the points of a triangle.

Two adjustment devices sit on a short leg of the support frame 7, one behind the other in the direction of extent. A vertical adjustment device 100 extends in alignment with a horizontal adjustment device 200. The push rod 110 and the pillar 222 are located at the two ends, facing away from each other, of the arrangement formed by the vertical adjustment device 100 and the horizontal adjustment device 200.

Two further mirror image arrangements of a vertical adjustment device 100 and a horizontal adjustment device 200 are located in the corner regions of the other short frame leg. Here, a vertical adjustment device 100 is located next to a horizontal adjustment device 200, wherein the push rod 110 is also arranged on the side facing away from the pillar 222. The arrangements of the vertical adjustment devices 100 and the horizontal adjustment devices 200 are such that the axes of rotation 107, 207 of the pivot bearings 106, 206 of the adjustment lever 101, 201 each point towards a point within the region surrounded by the support frame 7.

Figure 15:
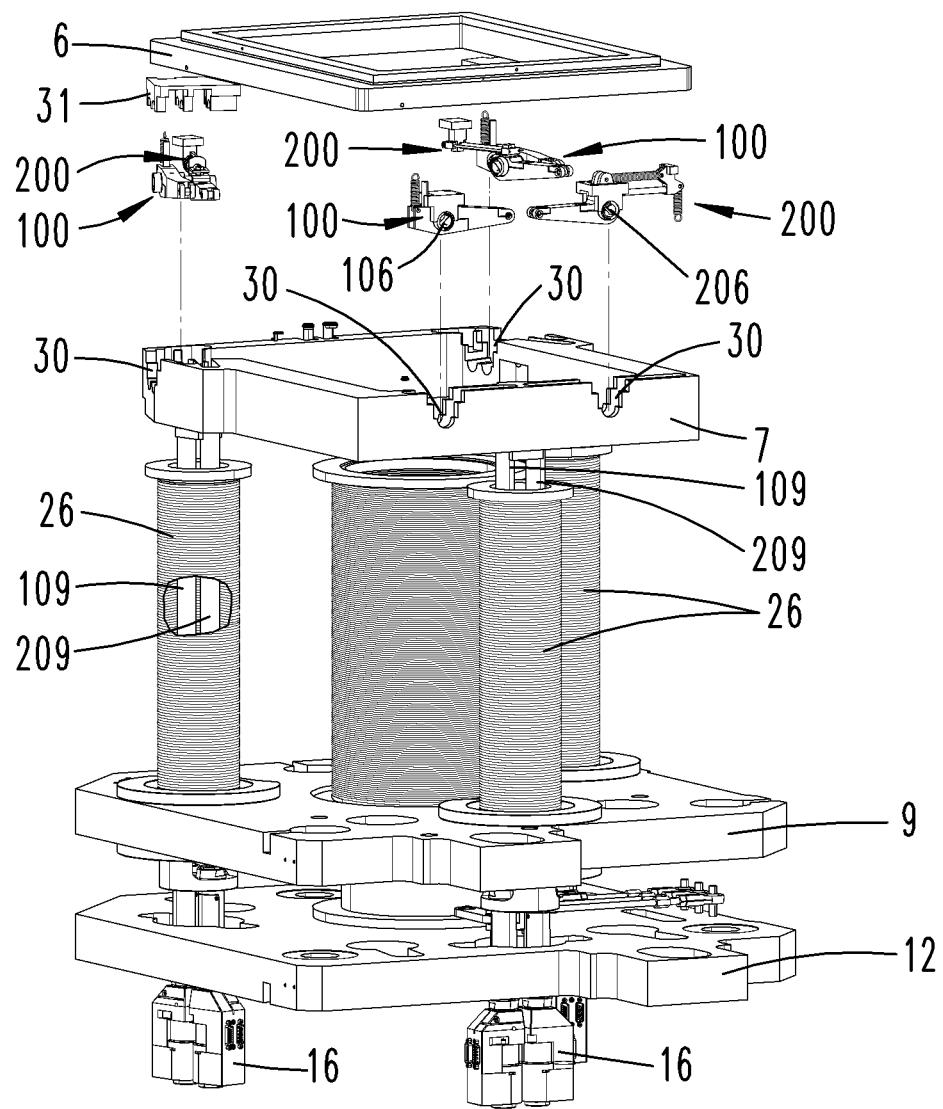
FIG. 15 shows an exploded view of some components of the device shown in FIG. 13.
Figure 16:
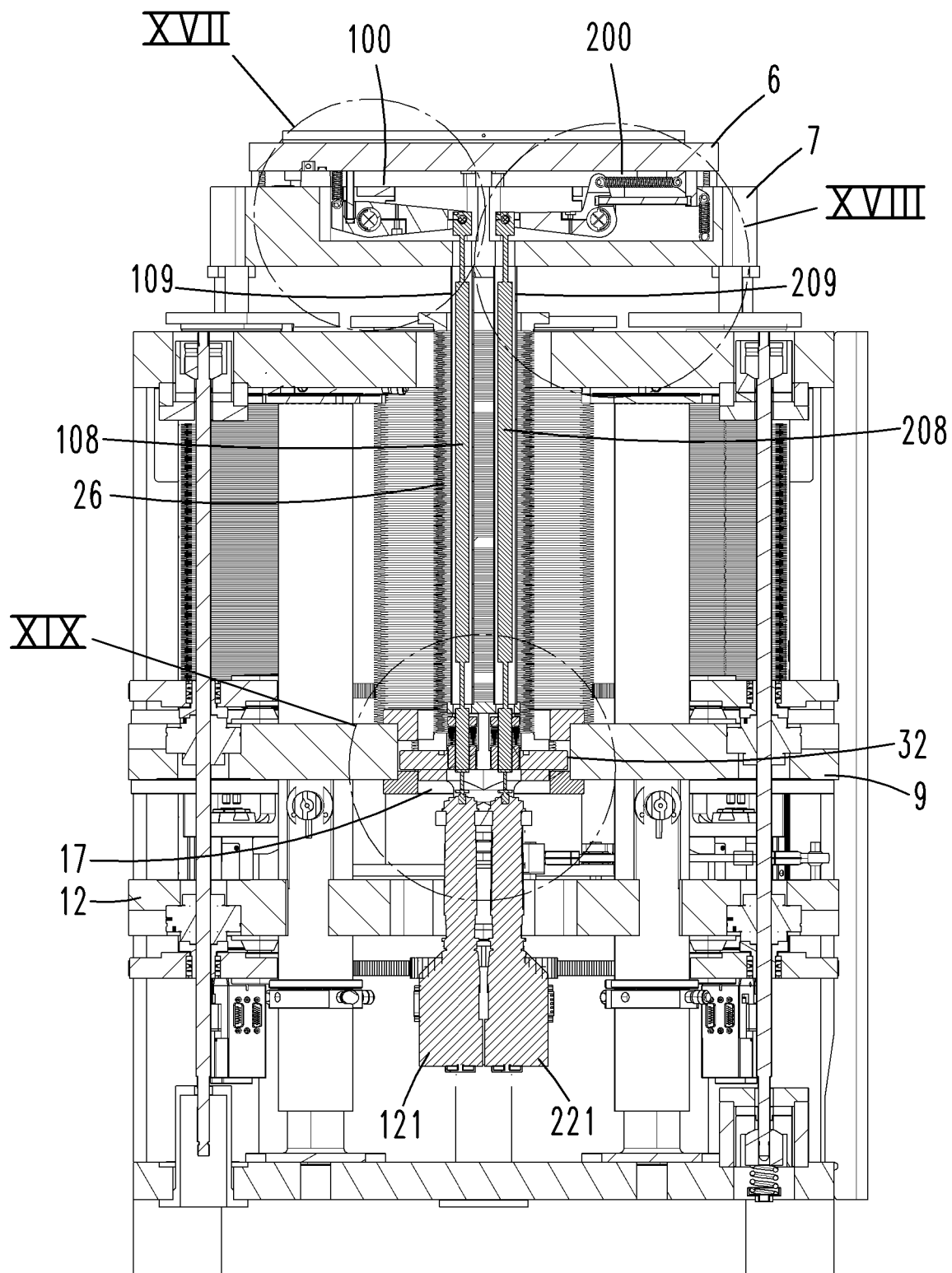
FIG. 16 shows a cross-section along the line XVI-XVI in FIG. 14.

FIG. 15 shows bearing recesses 30, in which the pivot bearings 206, 106 of the adjustment devices 100, 200 are mounted. These take the form in each case of semi-circular recesses, which are aligned with each other and in which the stub shafts of the pivot bearings 106, 206 are located. Bearing locking elements 31 are provided, which lock the bearing recesses 30 in the upwards direction.

FIG. 17 shows the cross-section through a vertical adjustment device 100. An adjustment lever 101 is mounted such that it can rotate about a pivot bearing 106. The adjustment lever 101 has a long arm, which extends in the horizontal direction. At an articulation point 104 at the end of the long arm 102, a control rod 108 is articulated, which extends through a control rod guide 109. A spring element 120 engages with a short arm 103 of the adjustment lever 101, which also extends in the horizontal direction; the short arm 103 is pulled upwards with the spring element. On the short arm 103 there is also a push rod 110, which is supported on the mask carrier 6.

FIG. 18 shows one of the plurality of examples of an embodiment of a horizontal adjustment device 200. A lever arm 201 is mounted about a pivot bearing 206. It has a long lever arm 202 and a short lever arm 203. The long lever arm 202 extends in the horizontal direction and at an articulation point 204 is articulated with a control rod 208, which extends in the vertical direction through a control rod guide 209.

The short lever arm 203 extends upwards in the vertical direction. A link arm 210 is articulated with the latter. The link arm 210 has a push rod 211 and a tensile member in the form of a spring element 220. The push rod 211 is supported with its one end on the short lever arm 203, and with its other end on a pillar 222, which is connected to the mask carrier 6 in a bending-resistant manner. A spring element 226 exerts a downwards load on the pillar 222. It is attached to the floor of the pocket 28.

FIG. 19 shows the passage 17 through the mask lifting plate 9. A component 35 is attached to the mask lifting plate 9, on which component an end plate 33 can be supported. A motion transmission means in the form of a bellows 26 is attached to the end plate 33. Outside the bellows is atmospheric pressure; inside the bellows is a vacuum or a reduced pressure. An edge region of the end plate 33 is spring-loaded by springs 22 against a component 34 which, like the component 35, is fixedly connected to the mask lifting plate 9. When the mask lifting plate 9 is lowered, the end plate 33 can detach from the component 35 to float in the space between the components 34 and 35.

The component 33 carries ring pieces 36, which form a passage 125 for the control rod 108 of the vertical adjustment device 100, and a passage 225 for the control rod 208 of the horizontal adjustment device 200. The ring pieces 36 are in each case end sections of bellows 223, 123, which at their other end form ring pieces 124, 224, which are fixedly connected to the push rods 108, 208. The bellows 123, 223 thus form the motion transmission means for the control rods 108 and 208. Inside the bellows 123, 223 is atmospheric pressure. Outside the bellows 123, 223 is a vacuum or a reduced pressure.

Above the ring pieces 124, 224 there is a bridge which is fixedly connected to the end plate 33. The control rod guides 109, 209, which are both tubular in form, are supported on the bridge 32. The control rod guides 109, 209 can perform the function of support columns so as to support the support frame 7 with the mask lifting plate 9, when the end plate 33 rests on the component 35. The bridge 32 is then preferably rigidly connected to the end plate 33.

The two lower ends of the control rods 108, 208 are connected to actuators 121, 221. The actuator housings, which are not shown in FIG. 19, are fixedly connected to the end plate 33 and thus also to the bridge 32.

The cross-section shown in FIG. 20 shows a backwards displaced cross-section similar to FIG. 19. The base plate 33 is supported here by way of spheres 37 relative to the component 35, which here forms two V-grooves 38, which are located opposite each other, and in which the spheres 37 lie.

FIG. 21 shows in a perspective view a leaf spring element 27, as is used in the pivot bearings 106 and 206. A central region 42 supports the adjustment lever 101 or 201. The adjustment lever has a circular opening for this purpose, which can be narrowed using a clamping screw, such that the central region 42 lies rotationally fixed in the bearing opening of the pivot bearing 106 or 206.

In both axial directions, the stub shafts 41, 43 protrude from the wide faces of the adjustment lever 101, 201. A joint 44 extends between two sections of the leaf spring 27, between the region of the stub shaft 41 and the central region 42, and between the stub shaft 43 and the central region 42. End sections of the leaf spring 27 are provided with webs 39 or 40 respectively, wherein the web 39 is located in the stub shaft regions 41, 43, and the web is located in the central region 42. If the central region 42 is rotated relative to the two outer stub shaft regions 41, 43, the webs 39, 40 bend such that a rotational motion can take place in a friction-free manner simply as a result of the bending. In the region of the joint 44, the sections 42 and 43 of the leaf spring then move relative to each other in the direction of rotation.

FIGS. 24-26 show the adjustment lever 101 of the vertical adjustment device. The push rod 110 is inserted into an opening 126. The leaf spring, which forms the pivot bearing 106, can be inserted into a bearing eye 127.

Figure 27:
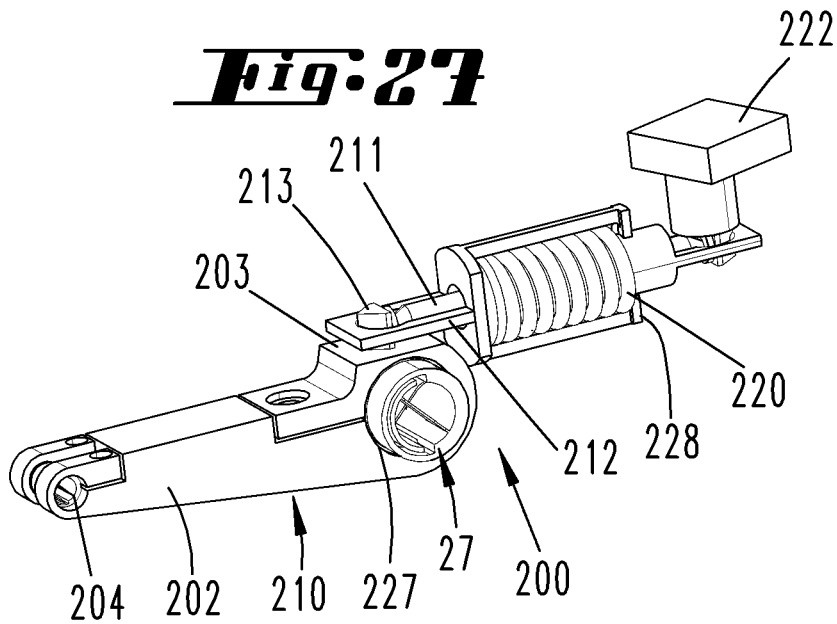
FIG. 27 shows, in a perspective view, a horizontal adjustment device 200.
Figure 28:
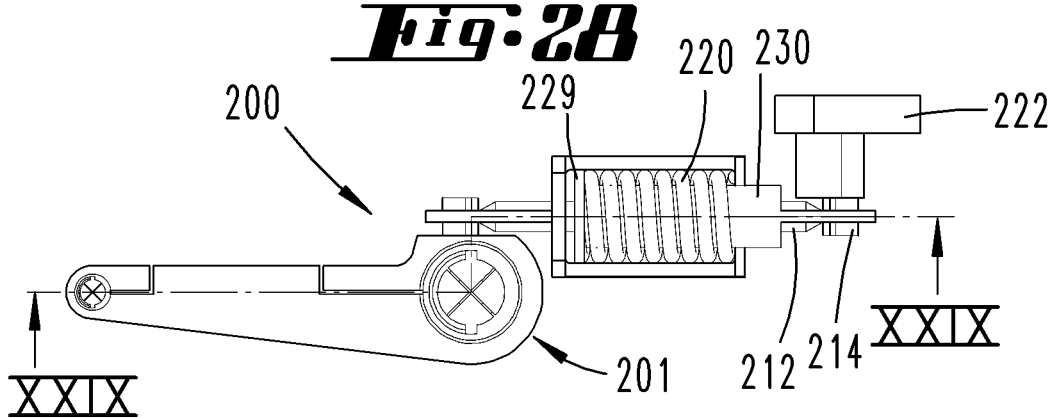
FIG. 28 shows the horizontal adjustment device in the side view.
Figure 29:
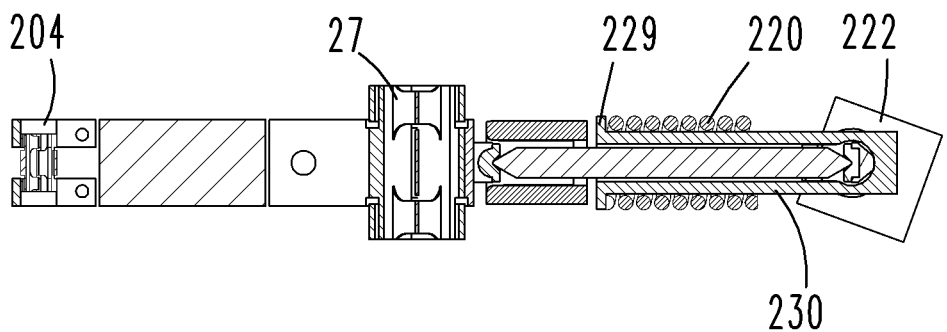
FIG. 29 shows the cross-section along the line XXIX-XXIX in FIG. 28.

FIGS. 27-29 show an example of an embodiment of a horizontal adjustment device. The adjustment lever 201 has a long arm 202, at the end of which is located the articulation point 204. The leaf spring bearing 27 is inserted in a bearing eye 227. A short lever arm 203 carries an end piece 213, which effectively forms the short lever arm 203. A tensile element 212 is supported on one face of the end piece. On the other face of the end piece 213 is supported a push rod 211. The tensile piece 212 has a cavity, through which the push rod 211 passes. The push rod 211 is supported with its other tip on an end piece 214, which sits on a pillar 222, which is fixedly connected to the mask carrier 6. A section 228 of the tensile member 212 engages behind a spring element 220 designed as a compression spring, which is supported on a projection 229 of another tensile element 230. The tensile element 230 has the form of a tube and supports the spring element 220 on its outer wall. The tensile element 230 is attached to the end piece 214. The tensile member here is formed by two tensile elements that are spring-loaded against each other.

FIGS. 30-32 show another example of an embodiment of a horizontal adjustment device 200 in which the tensile member 212 consists of two pull rods, which run parallel to each other. Here the adjustment lever 201 also has a bearing eye for the formation of the pivot bearing 206, in which a leaf spring bearing 27 is inserted. The bearing eye can be pressed onto the central region of the leaf spring bearing 27. For an explanation of this example of embodiment, reference is made to the explanations of FIG. 8.

The above statements serve to explain the inventions recorded by the application as a whole, which further develop the prior art at least by means of the following combinations of features and in each case also independently, wherein two, a plurality, or all of these combinations of features can also be combined, namely:

A device, which is characterized in that the adjustment device 100, 200 has an adjustment lever 101, 201, which is mounted on the support frame 7 such that it can rotate about an axis of rotation 107, 207 of a pivot bearing 106, 206, and has a first arm 102, 202 and a second arm 103, 203, wherein the second arm 103, 203 engages with the mask carrier 6, and a control rod 108, 208, which can be displaced vertically by an actuator 121, 221, engages with the first arm 102, 202.

A device, which is characterized in that in a vertical adjustment device 100, the second arm 103, and the first arm 102, extend in a horizontal direction, wherein the second arm 103 engages with a push rod 110, which is connected to the mask carrier 6.

A device, which is characterized in that in a horizontal adjustment device 200, the second arm 203 extends in the vertical direction, and the first arm 202 extends in the horizontal direction, wherein the second arm 203 is connected, with a link arm 210 that is articulated with the latter, to the mask carrier 6.

A device, which is characterized in that the first arm is a long arm of the adjustment lever 101, 201, and the second arm is a short arm of the adjustment lever 101, 201.

A device, which is characterized in that the link arm 210 of the horizontal adjustment device 200 is a prismatic joint, in which opposing tips 215 of a push rod 211 are each supported in a recess 216 of an end piece 213, 214, and in which a tensile member 212 engages with the end pieces 213, 214, and exerts a load on the tips 215 in the recesses 216.

A device, which is characterized in that the tensile member 212 is fixedly connected to an end piece 213 at an attachment point 217, wherein a spring element 220 acting with the tensile member is provided, which is supported on the tensile member 212 so as to apply force to one end piece 214 in the direction of the other end piece 213.

A device, which is characterized in that the tensile member 212 has a cavity, through which the push rod 211 is guided.

A device, which is characterized in that the tensile member 212 has two nested elements, wherein an inner one of the elements is surrounded by a spring element 220 in the form of a compression spring.

A device, which is characterized in that the pivot bearing 106, 206 is a frictionless leaf spring bearing.

A device, which is characterized in that the long lever arm 102, 202 is at least five times, preferably at least six times, as long as the short lever arm 103, 203.

A device, which is characterized in that the mask carrier 6, the adjustment levers 101, 201 and the support frame 7 are arranged such that they can be vertically displaced by means of a mask lifting device in a reactor housing 2 which is sealed in a gas-tight manner with respect to the external environment, wherein the control rods 108, 208 and support columns acting on the support frame 7 can be displaced from outside the reactor housing 2 by means of gas-tight motion transmission means.

A device, which is characterized in that the mask lifting device, which in particular has a mask lifting plate 9, is arranged outside the reactor housing 2.

A device, which is characterized in that the axes of rotation 107, 207 of the adjustment levers 101, 201 are directed towards a common point P1, P2, which is located in a plane framed by the support frame 7.

A device, which is characterized in that in each case three horizontal adjustment devices 200, and/or in each case three vertical adjustment devices 100, are provided, which in each case have adjustment levers 101, 201, whose axes of rotation 107, 207 are arranged offset relative to one another by an angle of between 100° and 160° relative to the common point P1, P2.

A device, which is characterized in that the control rods 108, 208 are guided in control rod guides 109, 209, wherein the control rod guides 109, 209 are attached to the support frame 7 with an upper end in a pressure-transmitting manner, and are attached to an actuator unit 16 housing with their lower end in a pressure-transmitting manner, wherein in particular provision is made for the actuator unit 16 to have an actuator 121 for purposes of displacing the control rod 108 of the vertical adjustment device, and an actuator 221 of the horizontal adjustment device 200.

A device, which is characterized in that a mask lifting plate 9, which can be displaced in the vertical direction by a drive unit, has an opening 17, through which the control rod guides 109, 209 connected to the actuator unit engage.

A device, which is characterized in that at the locations at which the vertical adjustment device 100 engages with the mask carrier 6, distance sensors 25 are provided, which are equipped so as to detect the vertical distance from an edge of the mask 4 to the substrate holder 10, or to the support frame 7.

A device, which is characterized in that the distance sensor 25 is an inductive or capacitive proximity switch or an optical distance measuring device.

A method, characterized by the following steps:
Displacement of a support frame 7 carrying a mask carrier 6 into a mask changing position;
Placement of a mask arrangement 3, having a mask frame 5 clamping a mask 4, on the mask carrier 6;
Vertical displacement of the support frame 7 together with the mask carrier 6 and the mask arrangement 3 from the mask changing position into a processing position, wherein the mask carrier 6 assumes an alignment position relative to the support frame 7;
Determination of the vertical distances 15 from each edge of the mask 4 at three locations, at which a vertical adjustment device engages with the mask carrier 6, to the support frame 7, or to a substrate holder 10 brought into a processing position;
Alteration of the distances by means of the vertical adjustment device 100 until the distances 15 are equal;
Displacement of the substrate holder 10 into a loading position;
Placement of a substrate 13 onto the substrate holder 10;
Displacement of the substrate holder 10 into the processing position, in which it has a minimum distance 15 from the mask 4, when the mask carrier 6 is located in the alignment position;
Horizontal adjustment of the mask carrier 6 by means of a horizontal adjustment device 200 until the mask 4 is brought into an alignment position relative to the substrate 13;
Lowering of the mask by means of the vertical adjustment device 100 from the alignment position into a contact position relative to the surface of the substrate 13.

A method characterized in that the vertical adjustment device 100 and/or the horizontal adjustment device 200 comprise adjustment levers 101, 201 which have a vertical movement of a control rod 108, 208 displaceable from an actuator 121, 221 arranged outside the reactor housing and which engages a push rod 110 or link arm 210 connected to the mask carrier 6.

A device characterized in that a central support column 11 supports the substrate holder 10 and a plurality of support columns 8 arranged in a periphery of the support column 11 support the support frame 7.

A device, which is characterized by restraining means 20, 21, which restrain the substrate holder 10 in the processing position on the support frame 7.

A device, which is characterized in that the restraining means comprise a V-groove 21 and a spherical surface 20.

A device, which is characterized in that the spherical surface 20 is formed by a spherical element of the support frame 7, and the spherical surface 20 is supported on the flanks of the V-groove 21, which is formed by the substrate holder 10.

A device, which is characterized in that the spherical elements are provided, which in each case interact with a V-groove 21, wherein the V-grooves 21 are aligned onto a common point.

A device, which is characterized in that the mask lifting device has at least one support column 8, which can be displaced in the vertical direction by a drive device arranged outside the reactor housing 2.

A device, which is characterized in that the substrate holder lifting device has at least one support column 11, which can be displaced in the vertical direction by a drive device arranged outside the reactor housing 2.

A device, which is characterized in that the mask lifting device, and/or the substrate holder lifting device, has a mask lifting plate 9 or a substrate lifting plate 12 extending in a horizontal direction, which is guided on a frame connected to the reactor housing 2.

A device, which is characterized in that gas-tight motion transmission means, in particular bellows arrangements, are provided, with which a vertical movement of the drive device is transmitted onto the support column 8, 11.

A device, which is characterized in that the support column 8 of the mask lifting device, in a processing position of the mask arrangement 3, in which the mask 4 rests in contact on the surface of the substrate 13, is mechanically decoupled from a mask lifting plate 9, which is attached to a frame mechanically coupled to the reactor housing 2, so that the support frame 7 is supported only by the substrate holder 10.

A device, which is characterized in that the mechanical decoupling of the support column 8 from the mask lifting plate 9 is achieved by the creation of a gap 14 between the support column 8 and the mask lifting plate 9.

A device, characterized by a spring element 22 for purposes of holding in position the support column 8 mechanically decoupled from the mask lifting plate 9.

A device or a method, characterized in that a central support column 11 supports the substrate holder 10, and a plurality of support columns 8 arranged in a periphery of the support column 11 support the support frame 7.

A device, characterized by an adjustment device 100, 200 for purposes of adjusting the position of the mask carrier 6 relative to the support frame 7, on which the adjustment device 100, 200 engages with a control rod 108, 208 that can be vertically displaced by an actuator 121, 221.

A device, which is characterized in that the control rods 108, 208 can be displaced by means of gas-tight motion transmission means from outside the reactor housing 2, which is sealed in a gas-tight manner with respect to the external environment.

All disclosed features are essential to the invention (both individually, and also in combination with one another). In the disclosure of the application, the disclosure content of the associated/attached priority documents (copy of the prior application) is hereby also incorporated in full, also for the purpose of incorporating features of these documents in the claims of the present application. The subsidiary claims characterize with their features independent inventive developments of the prior art in particular in order to make divisional applications on the basis of these claims. The invention specified in each claim can additionally comprise one or a plurality of the features described in the above description, in particular with features provided with reference symbols and/or specified in the list of reference symbols. The invention also relates to forms in which individual of the features mentioned in the above description are not implemented, in particular insofar as they are recognizably dispensable for the respective purpose, or can be replaced by other technically equivalent means.

LIST OF REFERENCE SYMBOLS

1 Gas inlet device
2 Reactor housing
3 Mask arrangement
4 Mask
5 Mask frame
6 Mask carrier
7 Support frame
8 Support column
9 Mask lifting plate
10 Substrate holder
10' Support surface
11 Support column
12 Substrate lifting plate
13 Substrate
14 Gap
15 Distance
16 Actuator unit
17 Opening
20 Spherical surface
21 V-groove
22 Spring element
23 Cooling passage
24 Extension
25 Distance sensor
26 Motion transmission means, bellows
27 Leaf spring, leaf spring bearing
28 Pocket
29 Pocket
30 Bearing recess
31 Bearing locking element
32 Bridge
33 End plate
34 Component
35 Component
36 Ring piece
37 Sphere
38 V-groove
39 Web
40 Web
41 Stub shaft axial end section
42 Central region
43 Stub shaft axial end section
100 Vertical adjustment device
101 Adjustment lever
102 Long arm
103 Short arm
104 Articulation point
105 Articulation point
106 Pivot bearings
107 Axis of rotation
108 Control rod
109 Control rod guide
110 Push rod
120 Spring element
121 Actuator
123 Bellows
124 Ring
125 Opening
126 Opening
127 Bearing eye
200 Horizontal adjustment device
201 Adjustment lever
202 Long arm
203 Short arm
204 Articulation point
205 Articulation point
206 Pivot bearing
207 Axis of rotation
208 Control rod
209 Control rod guide
210 Link arm
211 Push rod
212 Tensile member
213 End piece
214 End piece
215 Tip
216 Recess
216' Recess
217 Support element
217' Support element
218 Opening
219 Connecting piece
220 Spring element
221 Actuator
222 Pillar
223 Bellows
224 Ring
225 Opening
226 Spring element
227 Bearing eye
228 Section of the tensile member
229 Projection
230 Tensile element
$P_1$ Point
$P_2$ Point
α Angle

What is claimed is:

1. A device for depositing a layer structured by an application of a mask (4) onto a substrate (13), the device comprising:
a mask carrier (6);
a support frame (7) configured to support the mask carrier (6), wherein the support frame (7) comprises a first spherical element;
an adjustment device (100, 200) configured to adjust a position of the mask carrier (6) relative to the support frame (7), wherein the adjustment device (100, 200) is supported by the support frame (7);
a mask lifting device configured to move the support frame (7) the mask carrier (6) and a mask arrangement (3) in a vertical direction from a mask changing position into a processing position of the mask arrangement (3), wherein the mask arrangement (3) is carried by the mask carrier (6) and comprises the mask (4);
a substrate holder (10) comprising a first V-groove (21); and
a substrate holder lifting device configured to move the substrate holder (10) in the vertical direction from a loading position into a processing position of the substrate holder (10),
wherein, in the processing position of the substrate holder (10), flanks of the first V-groove (21) are configured to support the first spherical element of the support frame (7), causing the support frame (7) to be supported by substrate holder (10).

2. The device of claim 1, wherein the support frame (7) further comprises a second spherical element and the substrate holder (10) further comprises a second V-groove (21), and wherein flanks of the second V-groove (21) are configured to support the second spherical element of the support frame (7).

3. The device of claim 1, wherein the mask lifting device has at least one support column (8) that is configured to be displaceable in the vertical direction by a drive device arranged outside a reactor housing (2).

4. The device of claim 3, further comprising gas-tight movement transmission means by which a vertical movement of the drive device is transmitted onto the at least one support column (8, 11).

5. The device of claim 3, wherein the at least one support column (8) of the mask lifting device, in the processing position of the mask arrangement (3) is mechanically decoupled from a mask lifting plate (9), which is attached to a frame mechanically coupled to the reactor housing (2), so that the support frame (7) is supported only by the substrate holder (10).

6. The device of claim 5, wherein the mechanical decoupling of the at least one support column (8) from the mask lifting plate (9) comprises a gap (14) between the at least one support column (8) and the mask lifting plate (9).

7. The device of claim 5, further comprising a spring element (22) configured to hold in position the at least one support column (8) that is mechanically decoupled from the mask lifting plate (9).

8. The device of claim 1, wherein the substrate holder lifting device has at least one support column (11) that is configured to be displaced in the vertical direction by a drive device arranged outside a reactor housing (2).

9. The device of claim 1, wherein the mask lifting device has a mask lifting plate (9) extending in a horizontal direction, and/or the substrate holder lifting device has a substrate lifting plate (12) extending in the horizontal direction.

10. The device of claim 1, further comprising:
a central support column (11) configured to support the substrate holder (10); and
a plurality of support columns (8) configured to support the support frame (7), wherein the plurality of support columns (8) are arranged on a periphery of the central support column (11).

11. The device of claim 1, wherein the adjustment device (100, 200) engages with a control rod (108, 208) that is configured to be vertically displaced by an actuator (121, 221).

12. The device of claim 11, wherein the control rod (108, 208) is configured to be displaced by gas-tight movement transmission means from outside a reactor housing (2) that is sealed in a gas-tight manner with respect to an environment external from the reactor housing (2).

13. A device for depositing a layer structured by an application of a mask (4) onto a substrate (13), the device comprising:
a mask carrier (6);
a support frame (7) configured to support the mask carrier (6),
an adjustment device (100, 200);
a mask lifting device configured to move a support frame (7), the mask carrier (6), and a mask arrangement (3) in a vertical direction from a mask changing position into a processing position of the mask arrangement (3), wherein the mask arrangement (3) is carried by the mask carrier (6) and comprises the mask (4); and
a substrate holder lifting device configured to move the substrate holder (10) in the vertical direction from a mask changing position into a processing position of the substrate holder (10),
wherein each of the mask lifting device and the substrate holder lifting device have at least one support column (8, 11) that is configured to be displaced in the vertical direction by a drive device arranged outside the reactor housing (2),
wherein the at least one support column (8) of the mask lifting device is displaced with a mask lifting plate (9) extending in a horizontal direction, and
wherein, in the processing position of the mask arrangement (3), in which the mask (4) rests in contact on a surface of the substrate (13), the support column (8) of the mask lifting device is mechanically decoupled from the mask lifting plate (9), so that the support frame (7) is supported only by the substrate holder (10).

14. The device of claim 13, wherein the substrate holder lifting device has a substrate lifting plate (12) extending in a horizontal direction, which is guided on a frame connected to the reactor housing (2).

15. The device of claim 13, further comprising gas-tight movement transmission means or bellows arrangements, by which a vertical movement of the drive device is transmitted onto the at least one support column (8, 11).

16. The device of claim 13, wherein the mechanical decoupling of the support column (8) from the mask lifting plate (9) comprises a gap (14) between the support column (8) and the mask lifting plate (9).

17. The device of claim 13, further comprising a spring element (22) configured to hold in position the support column (8), while the support column (8) is mechanically decoupled from the mask lifting plate (9).

18. The device of claim 13, wherein the adjustment device (100, 200) is configured to adjust a position of the mask carrier (6) relative to the support frame (7), and the adjustment device (100, 200) engages with a control rod (108, 208) that is configured to be vertically displaced by an actuator (121, 221).

19. The device of claim 18, wherein the control rod (108, 208) is configured to be displaced by gas-tight movement transmission means from outside a reactor housing (2) that is sealed in a gas-tight manner with respect to an environment external to the reactor housing (2).

20. The device of claim 13, further comprising a control rod (108, 208) that engages with the adjustment device (100, 200), wherein the control rod (108, 208) extends within a control rod guide (109, 209) of the support column (8), and wherein the control rod (108, 208) is configured to be vertically displaced by an actuator (121, 221) arranged outside the reactor housing (2).

* * * * *